(12) United States Patent
Suzuki et al.

(10) Patent No.: US 10,894,294 B2
(45) Date of Patent: Jan. 19, 2021

(54) JET SOLDER LEVEL CONFIRMATION JIG AND METHOD OF HANDLING THE SAME

(71) Applicant: Senju Metal Industry Co., Ltd., Tokyo (JP)

(72) Inventors: Ryoichi Suzuki, Tokyo (JP); Yasuji Kawashima, Osaka (JP); Shigeo Komine, Tokyo (JP); Takashi Sugihara, Tokyo (JP); Hiroyuki Inoue, Saitama (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 16/767,873

(22) PCT Filed: Nov. 27, 2018

(86) PCT No.: PCT/JP2018/043556
§ 371 (c)(1),
(2) Date: May 28, 2020

(87) PCT Pub. No.: WO2019/107349
PCT Pub. Date: Jun. 6, 2019

(65) Prior Publication Data
US 2020/0290143 A1 Sep. 17, 2020

(30) Foreign Application Priority Data

Nov. 29, 2017 (JP) .................................. 2017-229252

(51) Int. Cl.
*B23K 1/00* (2006.01)
*B23K 1/08* (2006.01)
*H05K 3/34* (2006.01)

(52) U.S. Cl.
CPC ............... *B23K 1/085* (2013.01); *H05K 3/34* (2013.01)

(58) Field of Classification Search
CPC .. B23K 3/0653; B23K 1/085; B23K 2101/42; B23K 1/08; B23K 3/08; B23K 1/00;
(Continued)

(56) References Cited

U.S. PATENT DOCUMENTS 4,889,273 A * 12/1989 Kondo ................. B23K 3/0653
228/8
4,890,781 A * 1/1990 Johnson ................. B23K 1/085
228/11

(Continued)

FOREIGN PATENT DOCUMENTS

JP S4867026 U 8/1973
JP S5426067 U 2/1979
(Continued)

*Primary Examiner* — Erin B Saad
(74) *Attorney, Agent, or Firm* — The Webb Law Firm

(57) ABSTRACT

Provided are a jet solder level confirmation jig and a method of handling the same, which allow the level of the jet wave of the molten solder to be accurately confirmed. A jet solder level confirmation jig is provided with a level confirmation unit for confirming a level of a jet wave of molten solder, a holding unit that holds the level confirmation unit, a notifying unit that notifies the level of the jet wave of the molten solder; and a bridge member having a length so as to be able to form a bridge in an upper part of a jet solder bath housed within a housing, the bridge member supporting the level confirmation unit in the upper part of the jet solder bath. The notifying unit is connected to a power supply unit of a jet soldering device.

4 Claims, 19 Drawing Sheets

(58) Field of Classification Search
CPC .... B23K 1/0016; B23K 1/206; B23K 3/0638; B23K 3/0646; B23K 3/0669; B23K 3/0676; B23K 3/087
See application file for complete search history.

(56) References Cited

U.S. PATENT DOCUMENTS

| | | | | |
|---|---|---|---|---|
| 5,409,159 | A * | 4/1995 | Connors | B23K 3/0653 228/219 |
| 5,538,175 | A * | 7/1996 | Massini, Jr. | B23K 3/0653 228/102 |
| 5,617,988 | A * | 4/1997 | Willemen | B23K 3/0653 228/37 |
| 5,979,740 | A * | 11/1999 | Rooks | B23K 3/0653 228/103 |
| 6,119,915 | A * | 9/2000 | Thompson, Sr. | B23K 3/087 118/429 |
| 6,415,972 | B1 * | 7/2002 | Leap | B23K 3/0653 228/102 |
| 6,655,574 | B2 * | 12/2003 | Schouten | B23K 3/0653 228/37 |
| 9,272,351 | B2 * | 3/2016 | Willemen | B23K 3/0653 |
| 10,029,326 | B2 * | 7/2018 | Dautenhahn | B23K 3/0638 |
| 10,780,516 | B2 * | 9/2020 | Dautenhahn | B23K 3/0653 |
| 2018/0141168 | A1 * | 5/2018 | Sugihara | B23K 3/00 |

FOREIGN PATENT DOCUMENTS

| | | |
|---|---|---|
| JP | S6225825 U | 2/1987 |
| JP | S6244223 U | 3/1987 |
| JP | H26163 U | 1/1990 |
| JP | H8243732 A | 9/1996 |
| JP | 2011189395 A | 9/2011 |
| JP | 5288012 B2 | 9/2013 |
| JP | 6197942 B1 | 9/2017 |

* cited by examiner

JET SOLDER LEVEL CONFIRMATION JIG AND METHOD OF HANDLING THE SAME

CROSS-REFERENCE TO RELATED APPLICATIONS

This application is the United States national phase of International Application No. PCT/JP2018/043556 filed Nov. 27, 2018, and claims priority to Japanese Patent Application No. 2017-229252 filed Nov. 29, 2017, the disclosures of which are hereby incorporated by reference in their entirety.

TECHNICAL FIELD

The present invention relates to a jet solder level confirmation jig and a method of handling the same, which are applicable to the setting of a level of a jet wave of molten solder in a jet soldering device and to the uniform maintenance of the set level of the jet wave.

BACKGROUND ART

When soldering electronic components onto a predetermined surface of a printed circuit board, a jet soldering device has been often used in the past. In the jet soldering device, a fluxer, a preheater, a jet solder processing unit, a cooler, and the like are arranged at their predetermined positions. When soldering the electronic components onto the printed circuit board using this jet soldering device, the level of the jet wave of the molten solder is firstly set in response to a level from a jet solder bath in the jet solder processing unit to a convey position of the printed circuit board.

If the level of the jet wave of the molten solder is set to be too low, the solder does not reach the printed circuit board or may not adhere sufficiently. Conversely, if the level of the jet wave of the molten solder is set to be too high, the solder flows up to a rear surface of a surface to be soldered of the printed circuit board. Thus, the setting of the level of the jet wave of molten solder is an important step for applying a high-quality soldering process to the printed circuit board.

After the setting of the jet solder level, flux is applied to a surface of the printed circuit board with the fluxer; the printed circuit board is preheated with the preheater; and the printed circuit board and the electronic components are soldered together in the jet solder bath. In the jet solder bath, the jet solder processing is performed in which after the surface to be soldered of the printed circuit board is brought into contact with the rough molten solder jetted from a primary jet nozzle, it is then brought into contact with the smooth molten solder jetted from a secondary jet nozzle. After the solder processing is performed, the printed circuit board is cooled by the cooler.

When the jet soldering device continues to operate, oxidized solder (dross) accumulates in the jet solder bath. Therefore, even when the jet soldering device operates after the level of the jet wave of the molten solder is set to be a desired level, there may be a case where the level of the jet wave becomes lower, although power of a jet pump does not alter, when the dross accumulates in the jet nozzle for solder after the lapse of a predetermined time. Therefore, when the jet soldering device operates, it may be necessary to confirm a level of the wave of the molten solder jetted from the jet solder bath every time after a predetermined period of time lapses and to maintain the same constant.

In connection with the function of measuring a level of jet of the molten solder in the jet soldering device, Patent Document 1 has disclosed a jet solder level confirmation jig including a conductive level confirming member that performs at least either one of setting and measurement of the level of the jet wave of the molten solder. Further, Patent Document 2 has disclosed a measurement jig in which a plurality of members is fixed stepwise in a hollow box-like housing whose lower surface is open. Patent Document 3 has disclosed a measurement jig composed of a plurality of needles and a member that fixes and holds the needles.

PATENT DOCUMENTS

Patent Document 1: Japanese Patent No. 5288012
Patent Document 2: Japanese Patent Application Publication No. 2011-189395
Patent Document 3: J Japanese Utility Model Application Publication No. S48-67026

SUMMARY

However, in the conventional jigs which confirm the level of the jet wave of the molten solder as in Patent Documents 1 to 3, when the level of the jet wave is not a desired height, it may be impossible to precisely confirm how excess the jet wave is beyond the desired height or how insufficient the level of the jet wave satisfies the desired height. Therefore, with the conventional jigs, it may be necessary to repeat the operations of confirming the level of the jet wave of the solder while slightly adjusting the level thereof until the level reaches the desired height, which takes a lot of time for the operations.

Accordingly, the present invention has solved such a problem, and has an object to provide a jet solder level confirmation jig and a method of handling the same, which allow the level of the jet wave of the molten solder to be accurately confirmed and to be easily adjusted.

The technical means of the present invention adopted to solve the above-described problems are as follows:

(1) A jet solder level confirmation jig comprising a level confirmation unit for confirming a level of a jet wave of molten solder, a holding unit that holds the level confirmation unit, a notifying unit that notifies the level of the jet wave of the molten solder, and a bridge member having a length so as to be able to form a bridge in an upper part of a jet solder bath housed within a housing, the bridge member supporting the level confirmation unit in the upper part of the jet solder bath, wherein the level confirmation unit includes a sliding member that slides along a direction which is orthogonal to a longitudinal direction of the bridge member, and a plurality of conductive pins provided below the sliding member, the plurality of conductive pins being disposed such that tips of the plurality of conductive pins have different heights along a jetting direction of the jet wave of the molten solder, wherein the notifying unit includes a notifying member that performs a notifying operation, and a controlling unit connected to a power supply unit of a jet soldering device to drive the notifying member, wherein the bridge member and the sliding member have conductivity and the power supply unit and the controlling unit are connected via the bridge member and the sliding member, wherein the bridge member is detachably attached to supporting units provided on the housing, wherein the bridge member is supported by a pair of the supporting units, and wherein the bridge member is held on one of the supporting units by pressing a conductive member against the bridge member using one pressing member, which is provided in the one of the supporting units, for pressing the conductive member against the bridge member, and is held on the other one of the supporting units by pressing the other pressing member, which is provided in the other one of the supporting units, for pressing the bridge member against the bridge member using the other pressing member.

(2) The jet solder level confirmation jig according to the above-mentioned item (1) wherein the notifying member is any one or a combination of a light-emitting member that emits light of a predetermined color, a display member that performs a notification by display, a vibrating member that produces a predetermined sound, and a communication member that sends and notifies a state of contact between the molten solder and the level confirmation unit to an outside.

(3) The jet solder level confirmation jig according to the above-mentioned item (1) or (2), wherein the level confirmation unit includes a pin-retaining member which holds the plurality of pins, below the sliding member, the pin-retaining member being removably attached to the sliding member.

(4) A method for handling the jet solder level confirmation jig according to any one of the above-mentioned items (1) to (3), the method comprising the steps of adjusting a jet of the molten solder to a target jet level thereof, placing the jet solder level confirmation jig between the conductive members which are electrically connected to each other through the molten solder, regulating a holding position of the level confirmation unit with respect to the bridge member so that the jet of the molten solder is brought into contact with a tip of any of the plurality of pins, confirming a notifying operation of the notifying unit that operates when the jet of the molten solder is brought into contact with the tip of any of the pins, and controlling the jet of the molten solder so that the notifying unit performs the notifying operation after a predetermined period of time elapses since the confirmation of the notifying operation.

By the jet solder level confirmation jig according to the present invention, it may be possible to precisely confirm a state of contact or non-contact between the tip of any of the plurality of pins and the molten solder through the notifying operation by the notifying unit and to easily achieve precise adjustment. In addition, it may be possible to provide a jet solder level confirmation jig having a convenient-to-carry and simple structure. Furthermore, since the jet solder level confirmation jig receives power supply from the power supply unit of the jet soldering device, it may be possible to suppress the operation stoppage due to the consumption of the storage battery.

By the method for handling the jet solder level confirmation jig according to the present invention, it may be possible to precisely confirm the state of contact or non-contact between the tip of any of the plurality of pins and the molten solder through the notifying operation by the notifying unit and to easily achieve precise adjustment. In addition, since the level of the jet wave of the molten solder can be stored in the level confirmation unit, it is possible to easily adjust the jet wave of the molten solder to a desired level.

DETAILED DESCRIPTION

Hereinafter, the following will describe jet solder level confirmation jigs and methods for handling the same as embodiments according to the present invention with reference to the drawings.

[First Embodiment]

Figure 1:
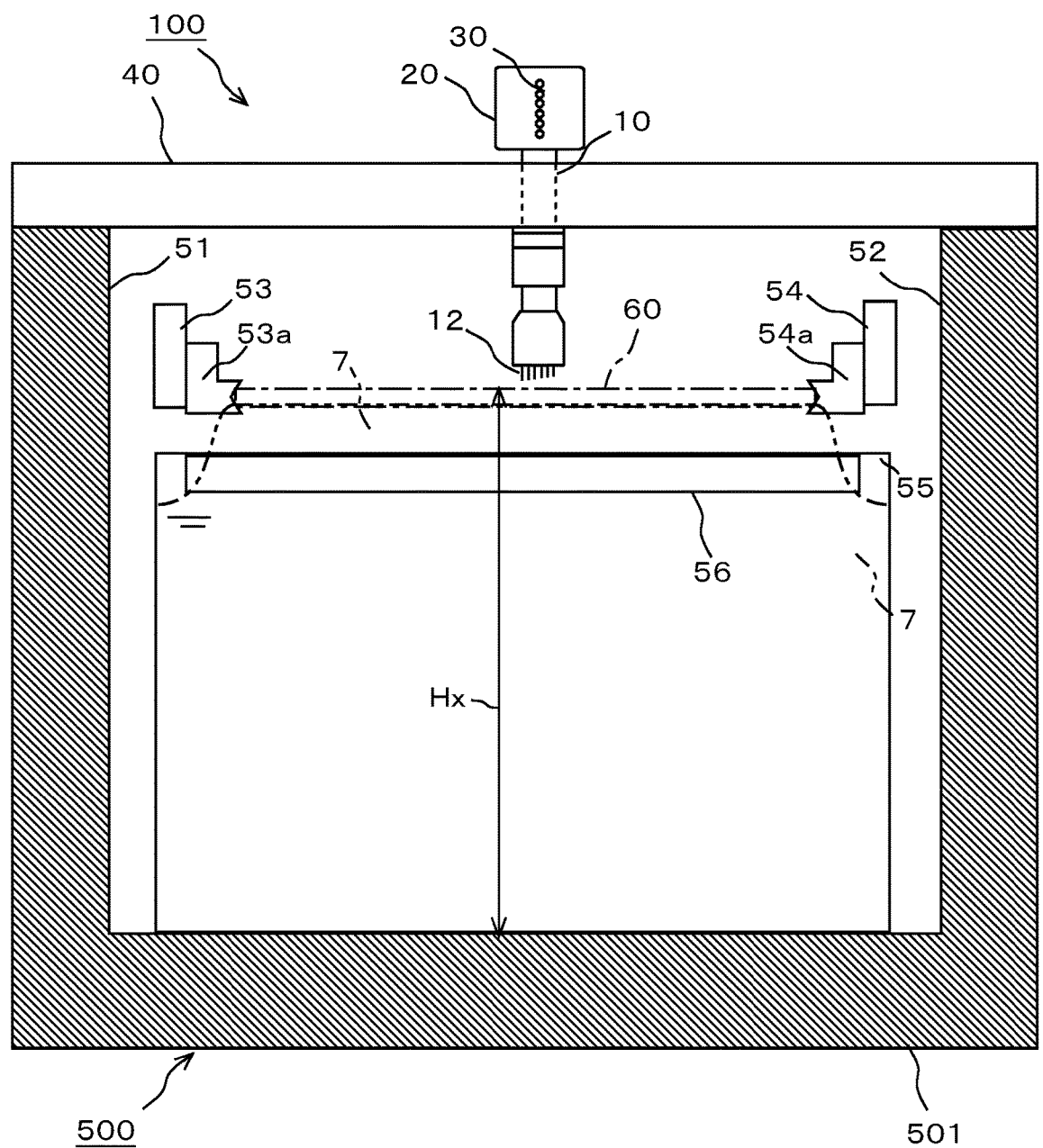
FIG. 1 is a diagram showing a configuration example of a jet solder level confirmation jig 100 as a first embodiment.

As shown in FIG. 1, the jet solder level confirmation jig 100 is a jig that is mounted above a jet soldering device 500. The following will describe a side on which the jet solder level confirmation jig 100 is mounted along a vertical direction of the jet soldering device 500 as an upper side and the contrary side thereof as a lower side. As the jet soldering device 500, an existing apparatus may be utilized. The jet soldering device 500 is provided with, for example, substrate-conveying units 53, 54 for conveying a printed circuit board 60, a jet solder bath 55 and a housing 501 which contains the jet solder bath 55 and has an upper surface opened.

The substrate-conveying units 53, 54 convey the printed circuit board 60 over a jet nozzle 56 from a front side of a sheet depicting FIG. 1 to a rear side thereof. The jet solder bath 55 is provided with the jet nozzle 56 having a predetermined open shape. The housing 501 is provided with metal members 51, 52 each having a predetermined thickness on both sides along a direction which is perpendicular to a conveying direction of the printed circuit board 60. The housing 501 has such a configuration that the metal members 51, 52 of the housing 501 are electrically connected to each other through molten solder 7 and the jet solder bath 55, which is not shown.

Further, when the substrate-conveying units 53, 54 are made of conductive materials, it may have a configuration as to utilize that the substrate-conveying units 53, 54 are electrically connected to each other through the molten solder 7. The substrate-conveying units 53, 54 are also provided with, as one example, conveying claws 53a, 54a having electric conductivity for putting the substrate therebetween to convey it.

The jet solder level confirmation jig 100 is provided with a level confirmation unit 10 which confirms a level of a wave of the molten solder 7 when the jet nozzle 56 jets it (hereinafter, referred to be simply "jet level"), a holding unit 20 which holds the level confirmation unit 10, an notifying unit 30 which notifies the jet level and a bridge member 40 which bridges over the housing 501.

Figure 2:
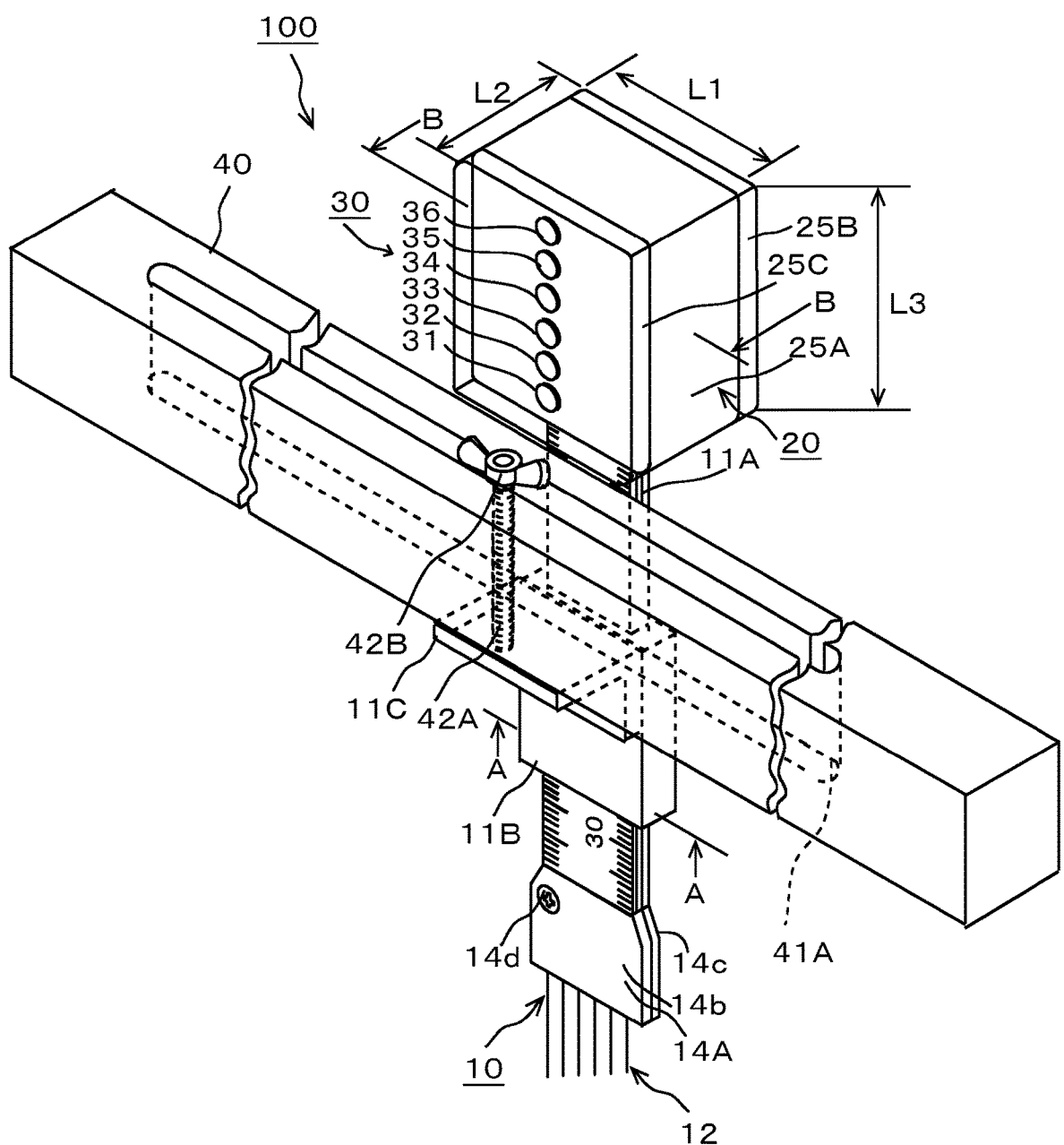
FIG. 2 is a perspective view showing a configuration example of the jet solder level confirmation jig 100.
Figure 4:
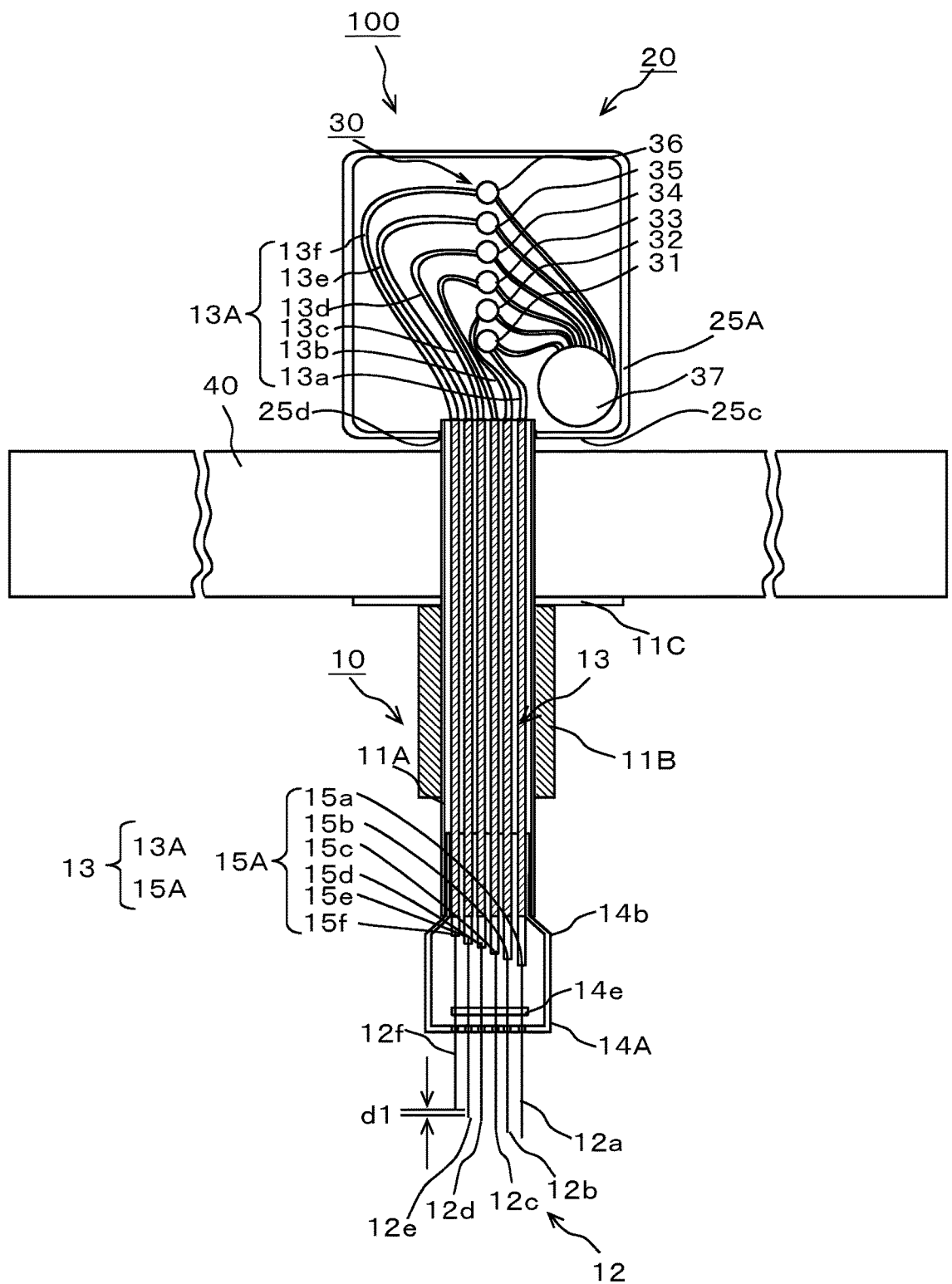
FIG. 4 is a cross-sectional view taken along the line B-B in FIG. 2, showing a configuration example of the jet solder level confirmation jig 100.

As shown in FIGS. 2 and 4, the level confirmation unit 10 is provided with a sliding member 11A that is held below the holding unit 20, a tubular member 11B that slidably holds the sliding member 11A, a plate member 11C that holds the sliding member 11A to the bridge member 40, plural pins 12 which are provided below the sliding member 11A, plural conductors 13 which are connected with the pins 12 and a pin-retaining member 14A which retains the pins 12.

Figure 3:
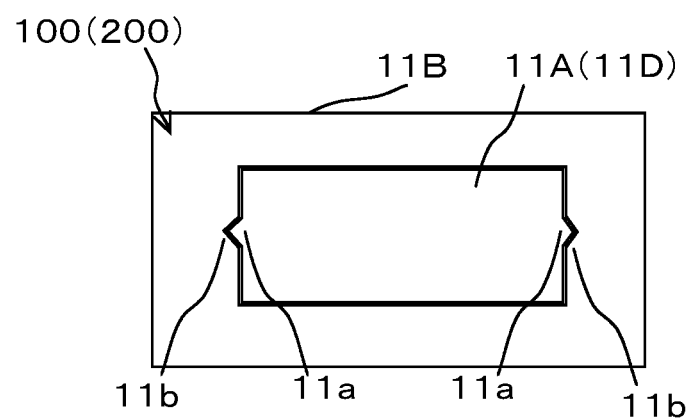
FIG. 3 is a cross-sectional view taken along the line A-A in FIG. 2, showing a configuration example of sliding members 11A, 11D and a tubular member 11B.

The sliding member 11A is made of conductive materials and has a long tubular shape. As shown in FIG. 2, a scale is marked on the sliding member 11A along the longitudinal direction thereof by a predetermined unit. It is preferable that the scale on the sliding member 11A indicates a distance from a tip of a pin which is arranged around the middle of the plural pins 12 because it is used as a mark of a position on which the sliding member 11A is fixed when the jet level of the molten solder 7 becomes a desired level, namely, a target level Hx of the jet. The sliding member 11A is screwed on a lower part of the holding unit 20. As shown in FIG. 3, the sliding member 11A has protrusions 11a extending along the longitudinal direction thereof.

The tubular member 11B is preferably made of conductive materials. As shown in FIG. 3, the tubular member 11B has a tubular shape with an aperture which is slightly larger than a circumference of the sliding member 11A and an internal circumference of the tubular member 11B and the circumference of the sliding member 11A are contacted. The tubular member 11B has hollows 11b on the internal circumference thereof and since the protrusions 11a of the sliding member 11A enter into the hollows 11b of the tubular member 11B, the sliding member 11A is slidable in the tubular member 11B but it is not slid unless any external force is applied thereto and it can be kept on its held state.

Going back to FIG. 2, when the sliding member 11A slides within the tubular member 11B, the level confirmation unit 10 slides toward a direction which is perpendicular to the longitudinal direction of the bridge member 40. In other words, when the sliding member 11A slides within the tubular member 11B, it is possible to slide the level confirmation unit 10 to a direction which approaches a liquid level of the molten solder 7 or moves away therefrom.

The plate member 11C has a shape so that a plate is perpendicularly bent and is provided for attaching the level confirmation unit 10, the holding unit 20 and the notifying unit 30 as one body to the bridge member 40. The plate member 11C is screwed onto a side surface of the tubular member 11B. The plate member 11C has a male screw 42A on a surface thereof that is perpendicular to a surface thereof screwed to the side surface of the tubular member 11B, the male screw projecting to a side on which it is attached to the bridge member 40.

As shown in FIG. 4, the plural pins 12 are made of the same material such as aluminum having conductivity and a heat-resisting property, which is indicative of non-affinity to the molten solder 7. The pins 12 are configured to have 6 pins 12a, 12b, 12c, 12d, 12e and 12f (hereinafter, referred to be "pins 12a through 12f"). The pins 12a through 12f are stored in a pin-retaining member 14A so as to be aligned and project from a lower part of the pin-retaining member 14A. The pins 12a through 12f have their tips projecting from the pin-retaining member 14A, lengths of the tips of which are longer in order of the pins 12a through 12f. A difference d1 between the adjacent pins in the lengths of the adjacent pins projecting downward from the pin-retaining member 14A is set to be 0.5 mm in this embodiment. The adjacent pins themselves are positioned at intervals of 2 mm to prevent a bridge by the solder adhered to each pin from occurring.

In addition, the difference d1 in the lengths projecting downward from the pin-retaining member 14A between the adjacent pins themselves and the distance between the adjacent pins themselves may be suitably changed according to various kinds of conditions such as a thickness of a substrate to be conveyed, precision for detecting the jet level, a kinds of solder alloy to be used for soldering, either use for a primary jet nozzle or a secondary jet nozzle, or the like.

Conductors 13 of the same numbers as the numbers of pins 12 extend along the longitudinal direction of the sliding member 11A and are fixed within the sliding member 11A. The conductors 13 are configured to stop an electric current from directly passing through the conductors 13 from the sliding member 11A even when the electric current passes through the sliding member 11A. In this embodiment, they are configured to include plural conducting wires 13A and conductors 15A which are respectively connected with the tips of the plural conducting wires 13A. The plural conducting wires 13A are configured to have 6 conducting wires 13a, 13b, 13c, 13d, 13e and 13f (hereinafter, referred to be "conducting wires 13a through 13f"). The conductors 15A are configured to have 6 columnar conductors 15a, 15b, 15c, 15d, 15e and 15f (hereinafter, referred to be "conductors 15a through 15f"). The conductors 15a through 15f have lengths projected from a lower part of the sliding member 11A on an opposite side of a side of the sliding unit 11A to which the holding unit 20 is attached, the lengths being longer in their order. The conductors 15a through 15f have hollows on their lower tips, to which the pins 12a through 12f are detachably attached.

As shown in FIG. 2, the pin-retaining member 14A is configured to combine a pair of insulating members 14b, 14c so as to have a cavity therein. The members 14b, 14c are screwed by a screw 14d. As shown in FIG. 4, a retaining part 14e retains the pins 12a through 12f in the pin-retaining member 14A. The pins 12a through 12f project downwards from apertures opened in an end of the pin-retaining member 14A, which is positioned at a side that is opposite to the sliding member 11A.

An upper portion of the pin-retaining member 14A is inserted into the sliding member 11A from a lower end of the sliding member 11A and the sliding member 11A and the pin-retaining member 14A are screwed by a screw, not shown. Therefore, by loosening the screw, the pin-retaining member 14A may be removed from the sliding member 11A.

In addition, when removing the pin-retaining member 14A from the sliding member 11A, the pins 12a through 12f are also removed from the hollows of the conductors 15a through 15f, so that the pins 12a through 12f are changeable together with the pin-retaining member 14A.

As shown in FIG. 2, the holding unit 20 includes a housing portion 25A, a rear cover 25B of the housing portion 25A, a transparent plate 25C. The holding unit 20 is made of insulating materials and has a dimension such as a width L1 of around 85 mm, a depth L2 of around 85 mm and a height L3 of around 85 mm. The rear cover 25B is screwed to the housing portion 25A by screws, not shown. The transparent plate 25C is screwed to the housing portion 25A on a side thereof that is opposite to the rear cover 25B by screws, not shown, and acts to protect the notifying unit 30. As shown in FIG. 4, a slit 25d is provided in a lower surface 25c of the housing portion 25A, an upper end of the sliding member 11A is inserted into the slit 25d and the sliding member 11A is screwed to the housing portion 25A by screws, not shown.

The holding unit 20 is provided with the notifying unit 30 for confirming contact action, and the notifying unit 30 performs a notifying operation. The notifying unit 30 has plural light-emitting members 31 through 36 as one example of the notifying member and a storage battery 37, in this embodiment, as a power supply.

Figure 5:
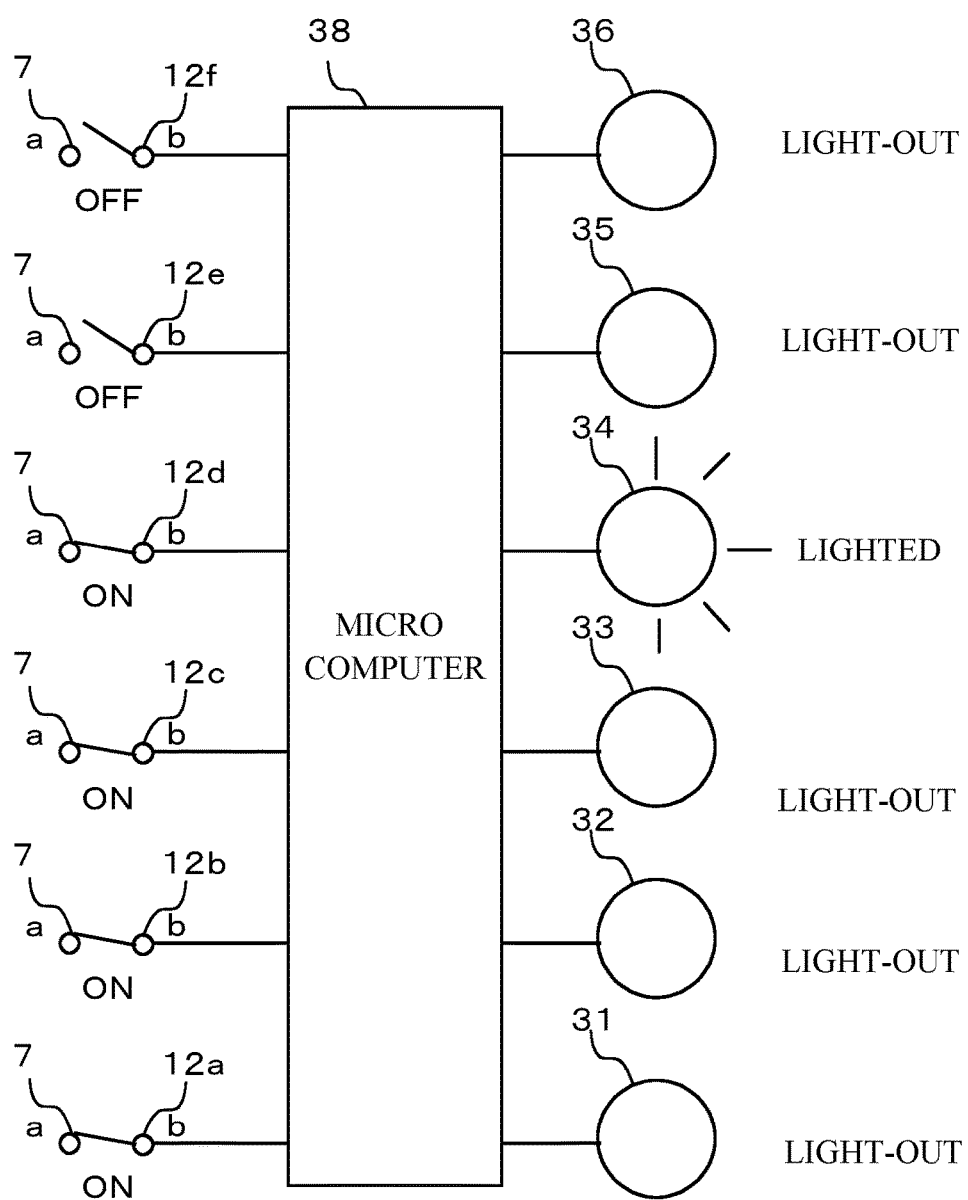
FIG. 5 is a block diagram showing the relationship between pins 12a to 12f and light-emitting members 31 to 36.

FIG. 4 approximately depicts a relationship between the pins 12a through 12f and the light-emitting members 31 through 36, with a microcomputer 38 shown in FIG. 5 being omitted. The light-emitting members 31 through 36 are connected to a negative pole of the storage battery 37 through the microcomputer 38, as one example of controlling unit.

The light-emitting members 31 through 36 are arranged in the housing portion 25A so as to be aligned on a vertical direction from the bottom in this order and they respectively project from holes provided in the housing portion 25A. The light-emitting members 31 through 36 are made of light emitting diodes. The light-emitting members 31 and 36 emit red color light, the light-emitting members 32 and 35 emit orange color light, and the light-emitting members 33 and 34 emit green color light.

As the storage battery 37, for example, a button battery is used. A negative electrode, not shown, is provided in the housing portion 25A in this embodiment and this negative electrode is connected to the negative pole of the storage battery 37. A positive electrode, which is connected to a positive pole of the storage battery 37, is provided in the rear cover 25B. A conductive wire, not shown, extending from the positive electrode, which is provided in the rear cover 25B, is connected to the sliding member 11A. The storage battery 37 is put between the positive and negative electrodes while the housing portion 25A and the rear cover 25B are closed.

When the jet solder level confirmation jig 100 is configured so that it is bridged on the metal members 51, 52 of the housing 501 storing the jet solder bath 55, the jet solder level confirmation jig 100 becomes a closed circuit, when the jet of the molten solder 7 contacts any of the tips of the pins 12, from the pins 12 to the molten solder 7 through the conductors 13, the microcomputer 38 shown in FIG. 5, the light-emitting members 31 through 36, the storage battery 37, the bridge member 40 and the metal members 51, 52 of the housing 501 storing the jet solder bath 55 and the light-emitting members 31 through 36 perform notifying operations. In addition, when the above-mentioned substrate-conveying units 53, 54 are made of conductive materials and the jet solder level confirmation jig 100 is configured so that it is bridged on these substrate-conveying units 53, 54, the jet solder level confirmation jig 100 becomes a closed circuit, when the jet of the molten solder 7 contacts any of the tips of the pins 12, from the pins 12 to the molten solder 7 through the conductors 13, the microcomputer 38 shown in FIG. 5, the light-emitting members 31 through 36, the storage battery 37, the substrate-conveying units 53 (54) and the conveying claws 53a (54a) and the light-emitting members 31 through 36 perform notifying operations.

Namely, in this embodiment, when the molten solder 7 contacts the pin 12a, an electric current flows through the conductor 15a and the conducting wire 13a to allow the light-emitting member 31 to emit red light. When the molten solder 7 contacts the pin 12b, an electric current flows through the conductor 15b and the conducting wire 13b to allow the light-emitting member 32 to emit orange light. When a jet wave of the molten solder 7 contacts the pin 12c, an electric current flows through the conductor 15c and the conducting wire 13c to allow the light-emitting member 33 to emit green light. When a jet wave of the molten solder 7 contacts the pin 12d, an electric current flows through the conductor 15d and the conducting wire 13d to allow the light-emitting member 34 to emit green light. When a jet wave of the molten solder 7 contacts the pin 12e, an electric current flows through the conductor 15e and the conducting wire 13e to allow the light-emitting member 35 to emit orange light. When a jet wave of the molten solder 7 contacts the pin 12f, an electric current flows through the conductor 15f and the conducting wire 13f to allow the light-emitting member 36 to emit red light. Thus, in this embodiment, based on the difference in the jet level of the molten solder 7, respectively different notifications are performed, thereby enabling 6 levels to be notified.

Since the light-emitting members 31 through 36 are connected to the microcomputer 38 shown in FIG. 5 and are lighted when receiving any instructions from the microcomputer 38, it is possible to program various kinds of settings about a notification pattern on color and lighting of the light-emitting members 31 through 36. As shown in FIG. 5, when the microcomputer 38 is programed to allow only the light-emitting member corresponding to a pin which contacts the molten solder 7 at the highest position among the pins 12 contacting the molten solder 7 to be lighted, two or more light-emitting members cannot be lighted at the same time. For example, when the pins 12a through 12d contact the molten solder 7, switches which are connections between the molten solder 7 and each of the pins 12a through 12d turn on but switches which are connections between the molten solder 7 and each of the pins 12e and 12f still turn off. Since the pin which contacts the molten solder 7 at the highest position among the pins 12a through 12d is the pin 12d, only the light-emitting member 34 corresponding to the pin 12d is lighted but other light-emitting members are not lighted.

As shown in FIG. 1, the bridge member 40 has a length that is able to bridge a gap between the metal members 51, 52 of the housing 501 storing the jet solder bath 55. As the bridge member 40, any conductive members, for example, nickel-chrome plated iron are used. As shown in FIG. 2, the bridge member 40 is provided with a long slit 41A with a width of about 5 mm which passes through both of upper and lower surfaces thereof.

By fastening a nut 42B on the male screw 42A provided on the plate member 11C via the long slit 41A, the level confirmation unit 10 is fixed to the bridge member 40. When loosening the nut 42B, the level confirmation unit 10 and the holding unit 20 may be slid along the slit 41A in the bridge member 40. By sliding the level confirmation unit 10 along the slit 41A in the bridge member 40, it is possible to change a position where the level of the molten solder 7 is confirmed along the longitudinal direction of the bridge member 40.

[Handling Example of Jet Solder Level Confirmation Jig 100]

Figure 6:
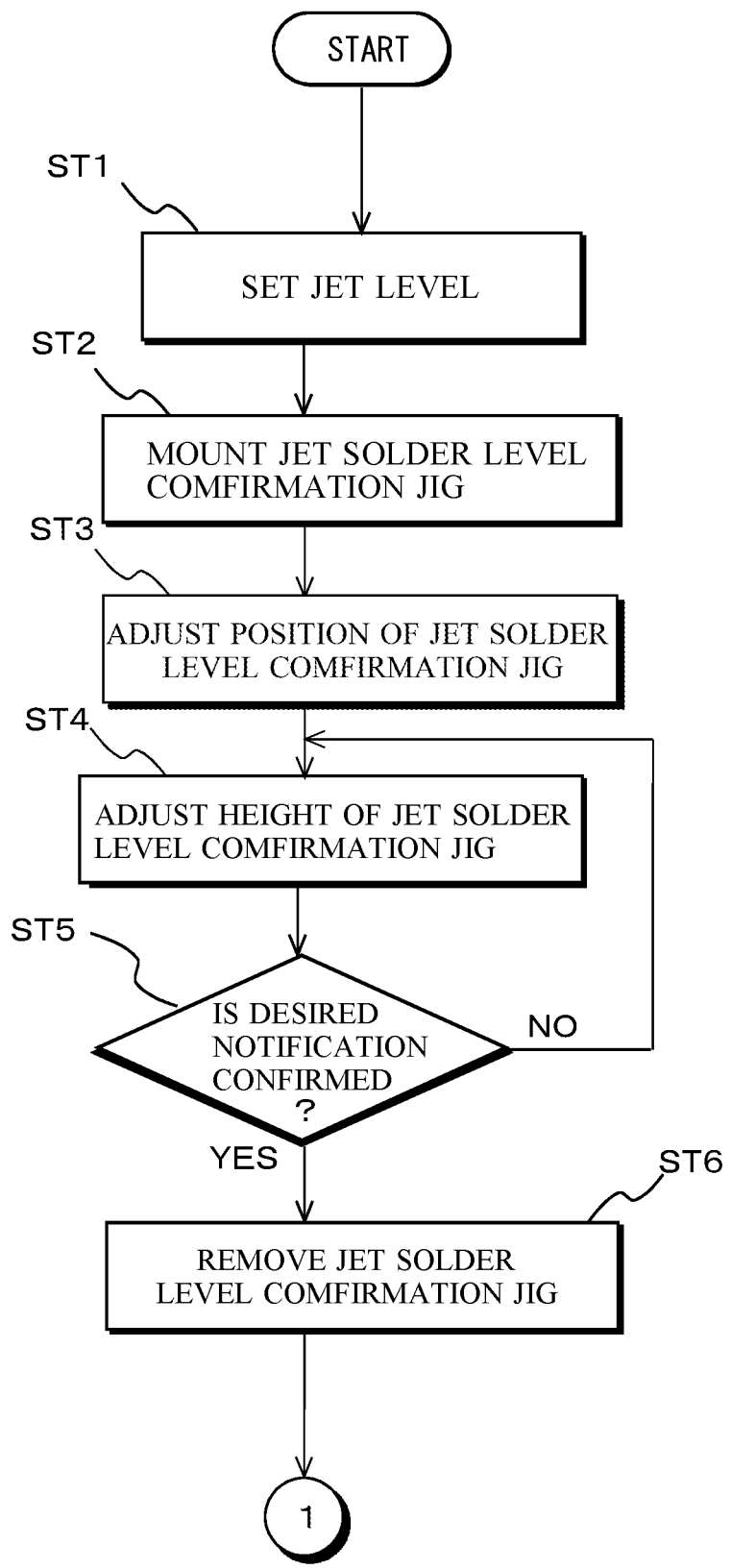
FIG. 6 is a procedure flow chart showing a handling example of the jet solder level confirmation jig 100.
Figure 7:
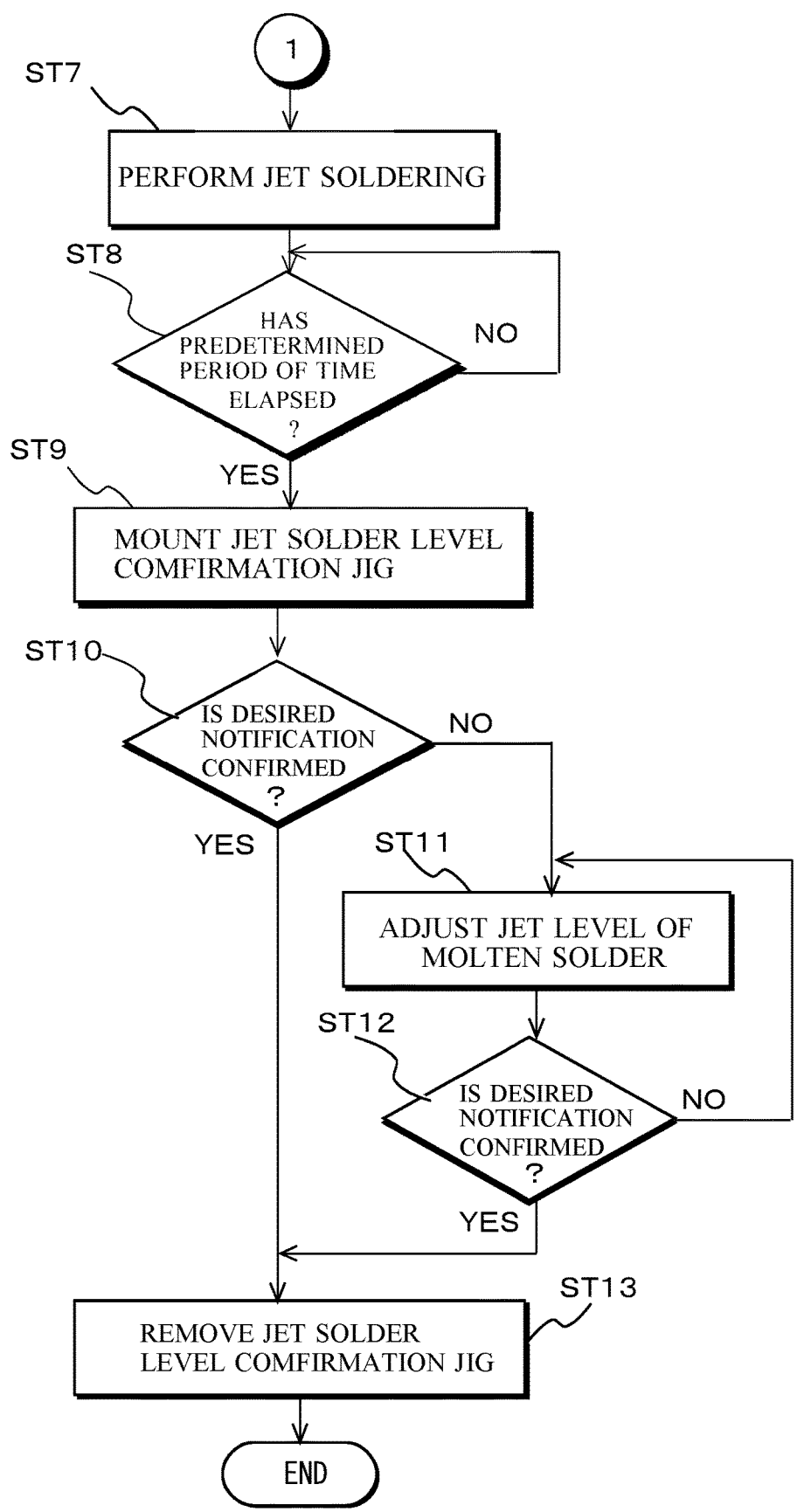
FIG. 7 is a procedure flow chart showing the handling example of the jet solder level confirmation jig 100.

The following will describe a handling example of the jet solder level confirmation jig 100 with reference to the procedure flow chart shown in FIGS. 6 and 7 and each of the other figures. In addition, in this embodiment, the following will describe a case where the jet solder level confirmation jig 100 is configured to bridge a gap between the metal members 51, 52 of the housing 501 storing the jet solder bath 55 and is applied to a secondary jet nozzle.

Step ST1: An operator manipulates a control panel, not shown, of the jet soldering device 500 shown in FIG. 1 to increase or decrease driving voltage of a jet pump, thereby setting the jet level of the molten solder 7 to be a desired level, namely, a target level Hx of the jet and jetting the molten solder. In this moment, the printed circuit board 60 is removed from a position above the substrate-conveying units 53, 54 and the jet solder bath 55.

Step ST2: The operator mounts the bridge member 40 on a gap between the metal members 51, 52 of the housing 501, thereby mounting the jet solder level confirmation jig 100 above the molten solder 7.

Step ST3: The operator moves the level confirmation unit 10 to a position where the jet level of the molten solder 7 should be confirmed. In more detail, he or she loosens the nut 42B fastened to the male screw 42A of the plate member 11C shown in FIG. 2, and moves the level confirmation unit 10, the holding unit 20 and the notifying unit 30 along the long slit 41 in the bridge member 40. When completing the positioning thereof, he or she fastens the nut 42B to the male screw 42A.

Step ST4: The operator adjusts height of the level confirmation unit 10 while he or she confirms the notification of the notifying unit 30. In this embodiment, it is set so that a situation where any of the light-emitting members 33, 34 switches on a green light is a desired notification and the sliding member 11A slides in the tubular member 11B until such a desired notification is performed to adjust heights of the pins 12 from the molten solder 7. When any one of the light-emitting members 31, 32 switches on, he or she slides the sliding member 11A to fall down so as to approach the molten solder 7. When any one of the light-emitting members 35, 36 switches on, he or she slides the sliding member 11A to lift up so as to move away from the molten solder 7.

Step ST5: The operator stops sliding the sliding member 11A when he or she confirms such a desired notification. In this moment, he or she may read and record a scale on the sliding member 11A, which indicates a lower end of the tubular member 11B. The scale on the sliding member 11A indicates a distance from a top of the molten solder 7 at the target level Hx of the jet to the tubular member 11B.

Step ST6: The operator removes the jet solder level confirmation jig 100 from the metal members 51, 52 of the housing 501. The level confirmation unit 10 keeps a condition in which the target level Hx of the jet is recorded.

Step ST7: The operator sets the printed circuit board 60 on the substrate-conveying units 53, 54 to perform the soldering.

Steps ST8, 9: The operator removes the printed circuit board 60 from a position above the substrate-conveying units 53, 54 and the jet solder bath 55 after a predetermined period of time elapses since the jet soldering process starts and again mounts the jet solder level confirmation jig 100 on the gap between the metal members 51, 52 of the housing 501. In this moment, he or she may confirm that a scale indicating a lower end of the tubular member 11B is maintained unchanged from the scale read in the step ST5.

Step ST10: The operator confirms the notification from the notifying unit 30. When confirming the desired notification, namely, any one of the light-emitting members 33, 34 switches on the green light, the process goes to a step ST13 because the jet level of the molten solder 7 is maintained unchanged from the target level Hx of the jet. In addition, even when a situation where any of the light-emitting members 33, 34 switches on a light is set to be a desired notification at the step ST4, such a desired notification may be obtained when any of the light-emitting members 33, 34 switches on a light at the step ST10. When the desired notification may not be confirmed, the process goes to a step ST11 for returning to the target level Hx of the jet because the jet level of the molten solder 7 is changed from the target level Hx of the jet.

Steps ST11, 12: When confirming no desired notification at the step ST10, the operator changes the jet level of the molten solder 7 by regulating the driving voltage of the jet pump or adding the solder until the desired notification is confirmed. When any of the light-emitting members 31, 32 switches on a light, he or she raises the jet level of the molten solder 7 by increasing the driving voltage of the jet pump or adding the solder because the jet level of the molten solder 7 becomes lower and any solder adhesion failure occurs at the printed circuit board 60 when the jet continues under this condition. When any of the light-emitting members 35, 36 switches on a light, he or she decreases the jet level of the molten solder 7 by decreasing the driving voltage of the jet pump because the jet level of the molten solder 7 becomes higher and the solder adheres up to an upper surface of the printed circuit board 60 when the jet continues under this condition, thereby causing any failure to occur at the substrate.

Step ST13: The operator removes the jet solder level confirmation jig 100 when he or she confirms the desired notification. The steps ST8 through ST13 may be repeatedly carried out once every predetermined time, for example, two hours.

[Second Embodiment]

The following will describe a jet solder level confirmation jig 200 according to the second embodiment with respect to respective figures. The jet solder level confirmation jig 200 is a variation of the jet solder level confirmation jig 100 according to the first embodiment. It is very different from the jet solder level confirmation jig 100 in that the pins 12 are configured to have 2 pins 12g, 12h and a communication member 39 shown in FIG. 9 for sending notifying instruction to an external terminal 39B is provided therein as the notifying unit. In the jet solder level confirmation jig 200, like sign is applied to like member in the jet solder level confirmation jig 100 according to the first embodiment, thereby omitting the detailed explanation thereof. The external terminal 39B is an operation unit (not shown) of a jet soldering device 500 as an example, and the operation unit of the jet soldering device 500 is composed of a display unit such as a display and an input unit such as a touch panel. The external terminal 39B may be an information processing device such as a personal computer connected to the jet soldering device 500, a portable information processing device such as a tablet connected to the jet soldering device 500, or the like.

Figure 8:
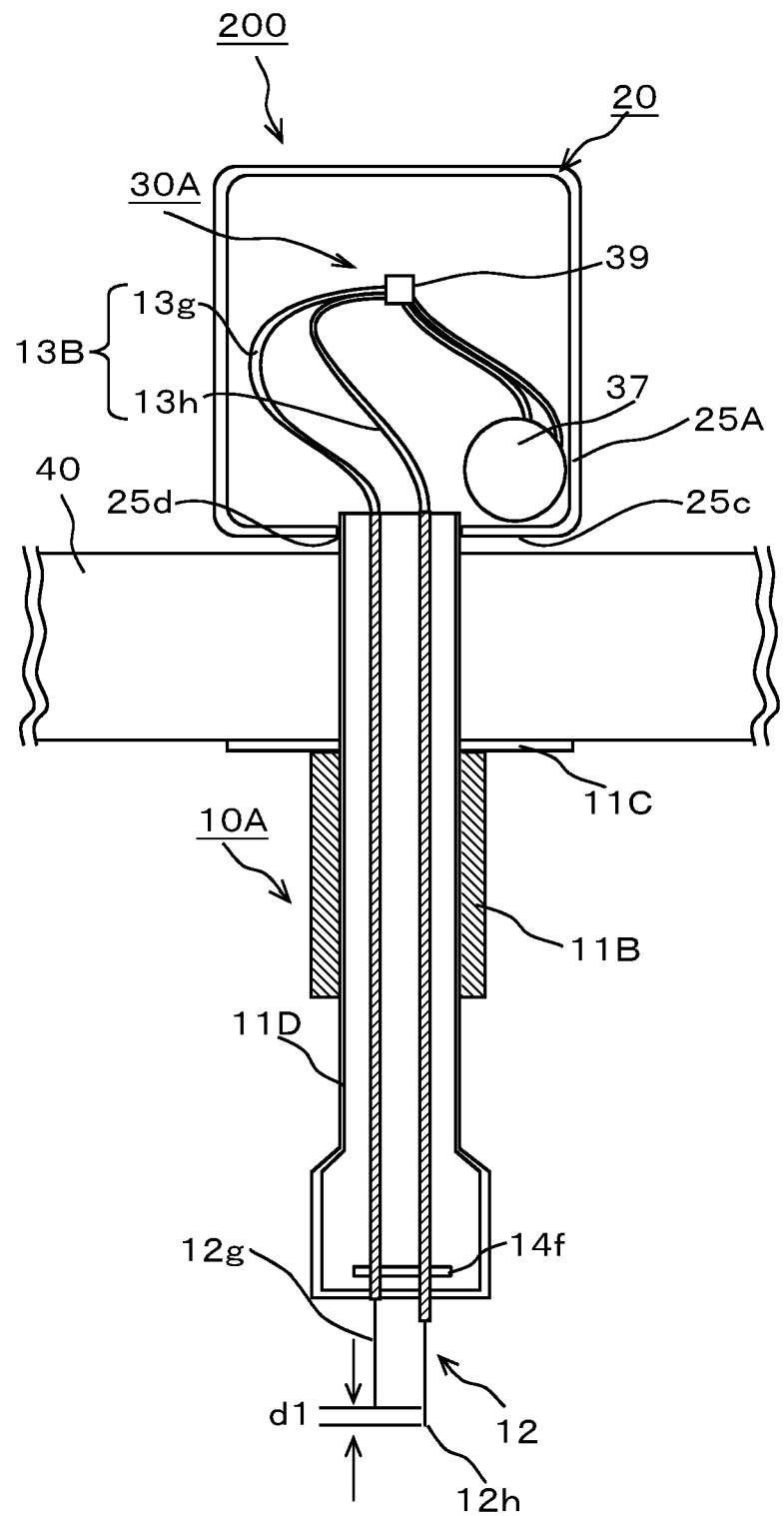
FIG. 8 is a cross-sectional view showing a configuration example of a jet solder level confirmation jig 200 as a second embodiment.

The jet solder level confirmation jig 200 is bridged above the housing 501 by the bridge member 40 to confirm the jet level of the molten solder 7 like the jet solder level confirmation jig 100 shown in FIG. 1. As shown in FIG. 8, it has a level confirmation unit 10A which confirms the jet level of the molten solder 7, a holding unit 20 which holds the level confirmation unit 10A, a notifying unit 30A for notifying the jet level and the bridge member 40.

The level confirmation unit 10A includes a sliding member 11D that is held below the holding unit 20, a tubular member 11B that slidably holds the sliding member 11D, a plate member 11C that holds the sliding member 11D to the bridge member 40, plural pins 12 which are provided below the sliding member 11D, and plural conductors 13B which are connected with the pins 12.

The sliding member 11D is made of conductive materials and has such a shape that a lower end of the sliding member 11A shown in the first embodiment is combined with an upper end of the pin-retaining member 14A. The sliding member 11D is screwed to a lower part of the holding unit 20 by a screw. The sliding member 11D has protrusions 11a extending along the longitudinal direction thereof like the sectional view of the sliding member 11A shown in FIG. 3. Since the protrusions 11a enter into the hollows 11b the sliding member 11D is also slidable in the tubular member 11B like the sliding member 11A but it is not slid unless any external force is applied thereto and it can be kept on its held state. Going back to FIG. 8, when the sliding member 11D slides within the tubular member 11B, the level confirmation unit 10A slides toward a direction which is perpendicular to the longitudinal direction of the bridge member 40.

The plate member 11C is provided for attaching the level confirmation unit 10A, the holding unit 20 and the notifying unit 30A as one body to the bridge member 40.

The pins 12g, 12h extend from a lower part of the sliding member 11D. Distances from tips of the pins 12g, 12h to a lower end of the sliding member 11D are shorter in an order of the pins 12g, 12h and a difference in the distances is set to be d1 (0.5 mm). The pins 12g, 12h are away from each other by 2 mm to prevent a bridge by the solder adhered to each pin from occurring.

Plural conductors 13B are configured to include a conducting wire 13g which is connected with the pin 12g and a conducting wire 13h which is connected with the pin 12h. The conducting wires 13g, 13h extend within the sliding member 11D along the longitudinal direction of the sliding member 11D and they are fixed on the lower end of the sliding member 11D so as to project therefrom. It is set so that even when an electric current flows through the sliding member 11D, the electric current does not directly flow from the sliding member 11D to the conducting wires 13g, 13h and the pins 12g, 12h. The conducting wires 13g, 13h are retained by a retaining portion 14f in the sliding member 11D.

As shown in FIG. 2, the holding unit 20 includes the housing portion 25A, the rear cover 25B of the housing portion 25A, the transparent plate 25C. As shown in FIG. 8, the slit 25d is provided in the lower surface 25c of the housing portion 25A, an upper end of the sliding member 11D is inserted into the slit 25d and the sliding member 11D is screwed to the housing portion 25A by screws, not shown.

The holding unit 20 is provided with the notifying unit 30A for confirming a contact action. The notifying unit 30A performs a notifying operation. The notifying unit 30A has a communication member 39 for performing a communication through wire or wirelessly and the storage battery 37.

Figure 9:
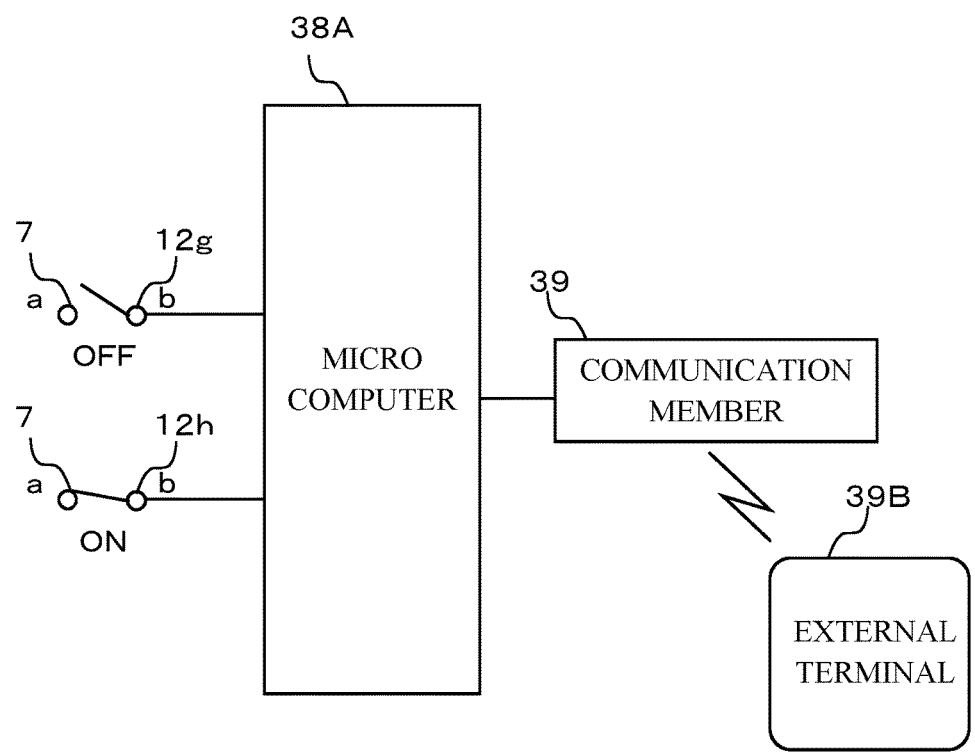
FIG. 9 is a block diagram showing the relationship between pins 12g, 12h and a communication member 39.

FIG. 8 approximately depicts with a microcomputer 38A shown in FIG. 9 being omitted. The communication member 39 is connected with a negative pole of the storage battery 37 through the microcomputer 38A. The communication member 39 is arranged in the housing portion 25A. The communication member 39 of this embodiment is organized by Bluetooth (registered trademark) and sends the notifying instruction to the external terminal 39B.

A negative electrode, not shown, that contacts the negative pole of the storage battery 37 is provided in the housing portion 25A and this negative electrode is connected to the negative pole of the storage battery 37. A positive electrode, which is connected to a positive pole of the storage battery 37, is provided in the rear cover 25B, which is not shown. A conducting wire extending from the positive electrode, which is provided in the rear cover 25B, is connected to the sliding member 11D.

It is configured so that the jet solder level confirmation jig 200 becomes a closed circuit, when the jet of the molten solder 7 contacts any of the tips of the pins 12, from the pins 12 to the molten solder through the conducting wires 13B, the microcomputer 38A shown in FIG. 9, the communication member 39, the storage battery 37, the bridge member 40 and the metal members 51, 52 of the housing 501 storing the jet solder bath 55, and the communication member 39 performs a notifying operation.

Namely, in this embodiment, when the molten solder 7 contacts the pin 12g, an electric current flows through the conducting wire 13g and the microcomputer 38A sends a predetermined instruction to the communication member 39. When the molten solder 7 contacts the pin 12h, an electric current flows through the conducting wire 13h and the microcomputer 38A sends a predetermined instruction to the communication member 39.

The communication member 39 is connected to the microcomputer 38A shown in FIG. 9 and receives any instruction from the microcomputer 38A to perform the notifying operation. Therefore, relating to a notification pattern of the communication member 39, various kinds of settings are programmable. For example, the microcomputer 38A is programmed to detect not only whether or not the molten solder 7 contacts any of the pins 12g, 12h but also any chattering of contacting or releasing the molten solder 7 to any of the pins 12g, 12h. In other words, the communication member 39 may notify 5 levels of a jet wave of the molten solder 7 of, in a higher order of the jet waves of the molten solder 7, a level of maintaining a condition of contacting the pin 12g, a level of chattering the pin 12g, a level of maintaining a condition of contacting the pin 12h but not contacting the pin 12g, a level of chattering the pin 12h, and a level of not contacting the pin 12h.

In this embodiment, when setting the level confirmation unit 10A to be a level of the molten solder 7 which maintains a condition of contacting the pin 12h but not contacting the pin 12g in a case where the molten solder 7 has the target level Hx of the jet, a switch which is a connection between the molten solder 7 and the pin 12h turns on but a switch which is a connection between the molten solder 7 and the pin 12g still turn off. In this moment, for example, the communication member 39 allows the external terminal 39B to display "Jet level becomes a target level" thereon. In addition, for example, the external terminal 39B may display "Jet level is too high" thereon when the molten solder 7 indicates the level of maintaining a condition of contacting the pin 12g; it may display "Jet level is high" thereon when the molten solder 7 indicates the level of chattering the pin 12g; it may display "Jet level is low" thereon when the molten solder 7 indicates the level of chattering the pin 12h; or it may display "Jet Level is too low" thereon when the molten solder 7 indicates the level of not contacting the pin 12h. Thus, the microcomputer 38A sends the notifying instructions to the communication member 39 based on the 5 levels of the molten solder 7 and the communication member 39 allows the external terminal 39B to perform a notification by display, sounds and/or the like based on the notifying instructions.

[Handling Example of Jet Solder Level Confirmation Jig 200]

The handling example of the jet solder level confirmation jig 100 shown in FIGS. 6 and 7 is applicable to the handling example of the jet solder level confirmation jig 200. Namely, at the step ST1, an operator sets the jet level of the molten solder 7 in the jet soldering device 500 shown in FIG. 1 to be the target level Hx of the jet and jets the molten solder. In this moment, the printed circuit board 60 is removed from a position above the substrate-conveying units 53, 54 and the jet solder bath 55.

At the step ST2, the operator mounts the bridge member 40 on a gap between the metal members 51, 52 of the housing 501, thereby mounting the jet solder level confirmation jig 200 above the molten solder 7. At the step ST3, the operator moves the level confirmation unit 10A to a position where the jet level of the molten solder 7 should be confirmed by sliding the level confirmation unit 10A along the long slit 41 in the bridge member 40.

At the step ST4, the operator adjusts height of the level confirmation unit 10A while he or she confirms the notification of the notifying unit 30A. He or she adjusts heights of the pins 12 from the molten solder 7 by sliding the sliding member 11D in the tubular member 11B until the communication member 39 sends the desired notifying instruction to the external terminal 39B. At the step ST4, for example, he or she adjusts height of the level confirmation unit 10A so that the molten solder 7 has the level of maintaining a condition of contacting the pin 12h but not contacting the pin 12g. When the molten solder 7 has the level of maintaining a condition of contacting the pin 12h but not contacting the pin 12g, the communication member 39 sends the notifying instruction to the external terminal 39B to allow the external terminal 39B to display "Jet level becomes a target level".

At the step ST5, the operator stops sliding the sliding member 11D when he or she confirms such a desired notification. At the step ST6, the operator removes the jet solder level confirmation jig 200 from the metal members 51, 52 of the housing 501. Accordingly, the level confirmation unit 10A keeps a condition in which the target level Hx of the jet is recorded.

At the step ST7, the operator sets the printed circuit board 60 on the substrate-conveying units 53, 54 to perform the soldering. At the steps ST8, 9, the operator removes the printed circuit board 60 from a position above the substrate-conveying units 53, 54 and the jet solder bath 55 after a predetermined period of time elapses since the jet soldering process starts and again mounts the jet solder level confirmation jig 200 on the gap between the metal members 51, 52 of the housing 501.

At the step ST10, the operator confirms the notification from the notifying unit 30A. When the operator confirms the desired notification such that the external terminal 39B displays "Jet level becomes a target level", the process goes to the step ST13. When the desired notification may not be confirmed, the process goes to the step ST11 for returning to the target level Hx of the jet because the jet level of the molten solder 7 is changed from the target level Hx of the jet.

At the steps ST11, 12, the operator changes the jet level of the molten solder 7 by regulating the driving voltage of the jet pump or adding the solder until the desired notification is confirmed. For example, when the external terminal 39B displays "Jet level is too high" or "Jet level is high", the operator decreases the jet level of the molten solder 7 by decreasing the driving voltage of the jet pump. When the external terminal 39B displays "Jet level is too low" or "Jet level is low", the operator raises the jet level of the molten solder 7 by increasing the driving voltage of the jet pump.

At the step ST13, the operator removes the jet solder level confirmation jig 200 when he or she confirms the desired notification. The steps ST8 through ST13 may be repeatedly carried out once every predetermined time, for example, two hours.

[Third Embodiment]

The following will describe a jet solder level confirmation jig 300 according to the third embodiment with respect to respective figures. The jet solder level confirmation jig 300 is a variation of the jet solder level confirmation jig 100 according to the first embodiment. It is very different from the jet solder level confirmation jig 100 in that the sliding member 11E and the plural pins 12 are rotatable around the bridge member 40B like an arrow D shown in FIG. 10 and in the configurations of the pin-retaining member 14B and the notifying unit 30B. In the jet solder level confirmation jig 300, like sign is applied to like member in the jet solder level confirmation jig 100 according to the first embodiment, thereby omitting the detailed explanation thereof.

Figure 10:
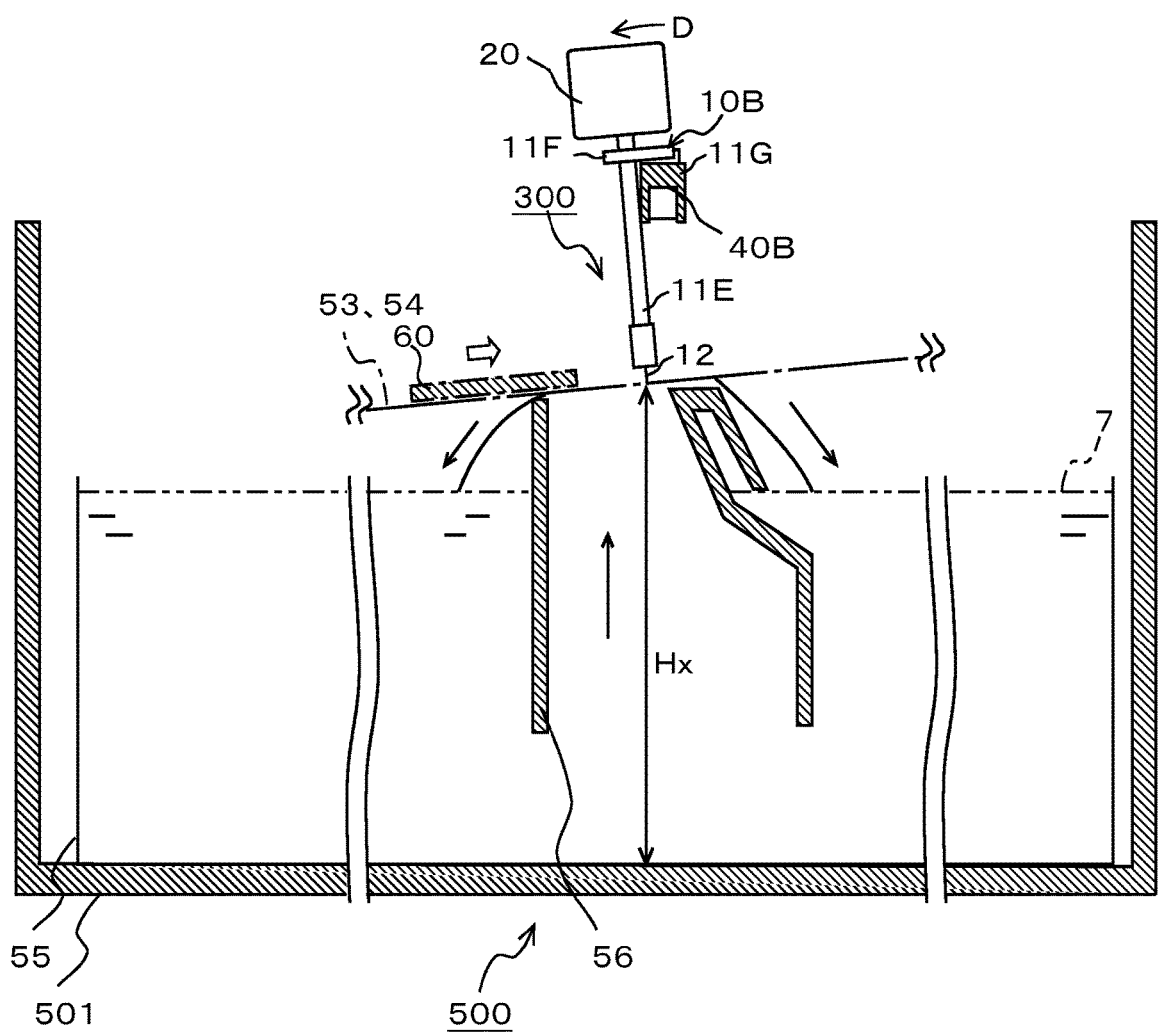
FIG. 10 is a diagram showing a configuration example of a jet solder level confirmation jig 300 as a third embodiment.

The jet solder level confirmation jig 300 is mounted above the jet soldering device 500 to confirm the jet level of the molten solder 7 like the jet solder level confirmation jig 100 shown in FIG. 1. As shown in FIG. 10, the jet soldering device 500 is provided with, for example, substrate-conveying units 53, 54 for conveying a printed circuit board 60, a jet solder bath 55 and a housing 501 which contains the jet solder bath 55 and has an upper surface opened. As shown in FIG. 1, the housing 501 is provided with metal members 51, 52 each having a predetermined thickness on both sides along a direction which is perpendicular to a conveying direction of the printed circuit board 60. The jet solder bath 55 is provided with the jet nozzle 56 having a predetermined open shape.

The substrate-conveying units 53, 54 mount the printed circuit board 60 and convey it over the jet nozzle 56 from a left side to a right side of a sheet depicting FIG. 10 with an angle of elevation as shown by an arrow outline with a blank inside in FIG. 10. In this embodiment, the substrate-conveying units 53, 54 with a predetermined angle, for example, about 5 degrees convey the printed circuit board 60.

Figure 11:
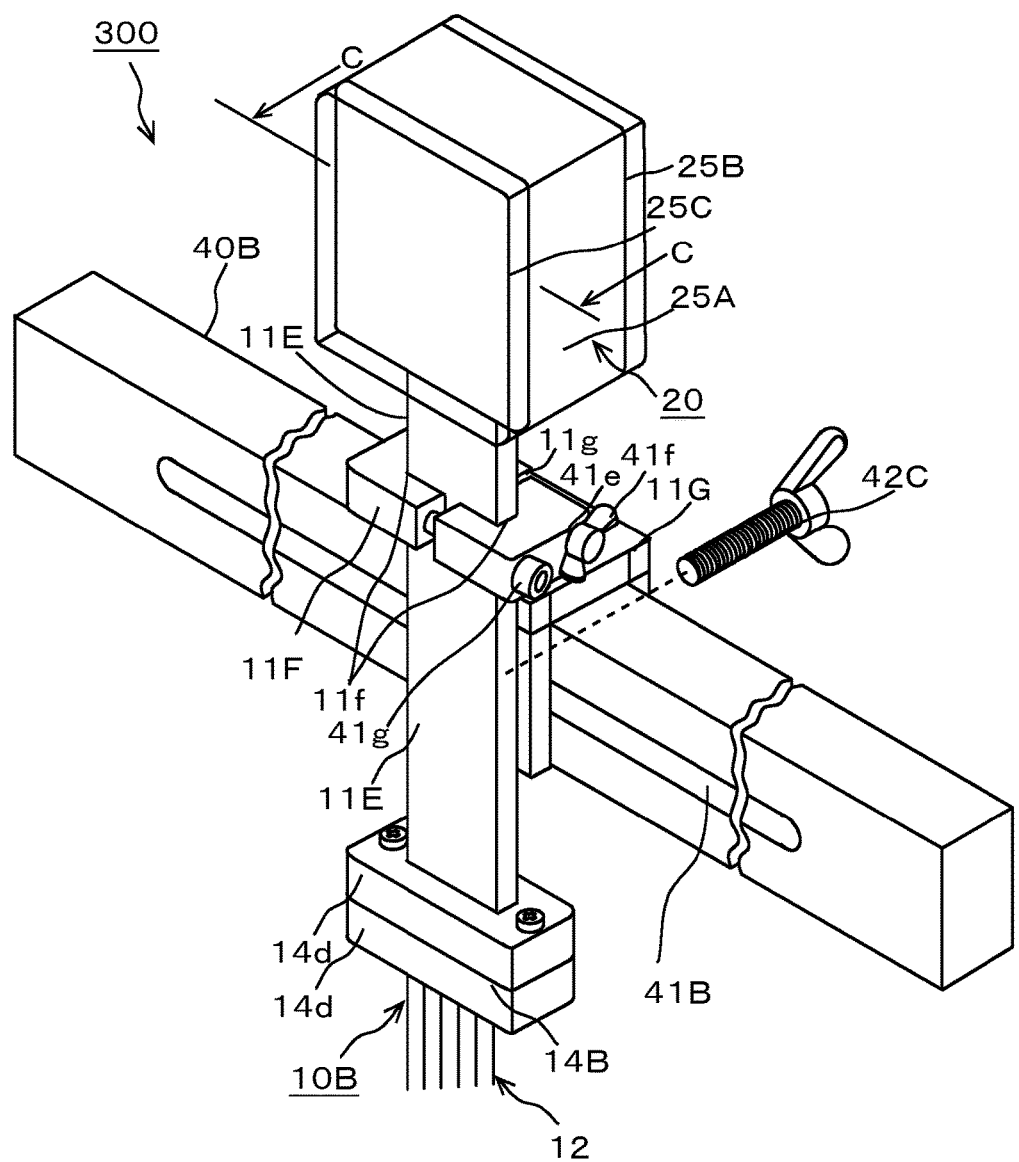
FIG. 11 is a perspective view showing a configuration example of the jet solder level confirmation jig 300.
Figure 12:
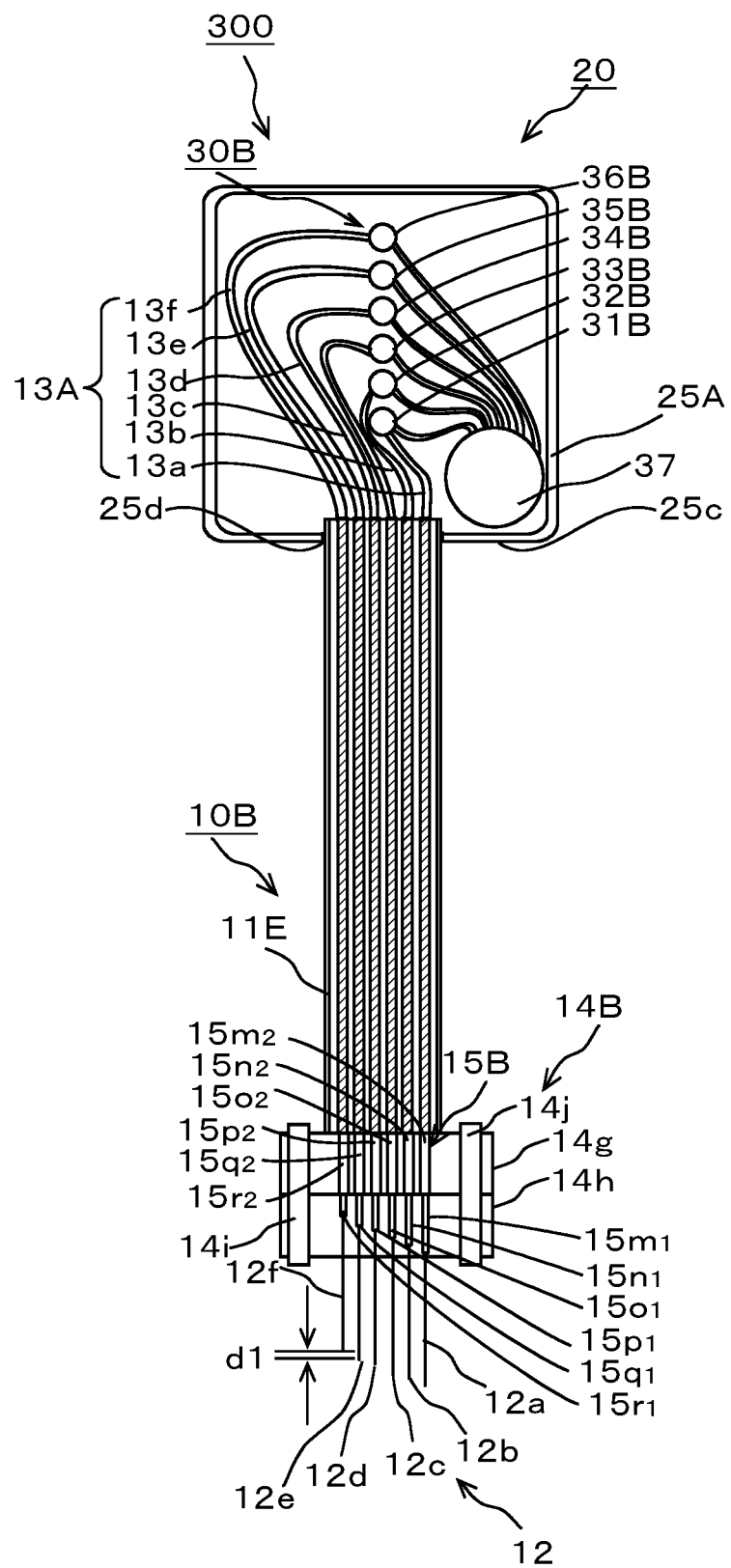
FIG. 12 is a cross-sectional view taken along the line C-C in FIG. 11, showing a configuration example of the jet solder level confirmation jig 300.

As shown in FIGS. 11 and 12, the jet solder level confirmation jig 300 has a level confirmation unit 10B which confirms the jet level of the molten solder 7, a holding unit 20 which holds the level confirmation unit 10B, a notifying unit 30B for notifying the jet level and the bridge member 40B.

The level confirmation unit 10B includes a sliding member 11E that is held below the holding unit 20, a pinching member 11F that slidably pinches the sliding member 11E, a retaining member 11G which retains the sliding member 11E to the bridge member 40, plural pins 12 which are provided below the sliding member 11E, plural conductors 15B which are connected with the pins 12, conducting wires 13A which are connected with the conductors 15B and a pin retaining member 14B which retains the pins 12.

The sliding member 11E is made of conductive materials and has a long tubular shape. The sliding member 11E is screwed on a lower part of the holding unit 20.

The pinching member 11F is preferably made of conductive materials. The pinching member 11F is provided on the retaining member 11G so that it is rotatable around the retaining member 11G. The pinching member 11F is arranged so that a pair of members each having a recess portion 11$f$ between two protrusions faces each other with each recess portion 11$f$ being opposite to each other. The pinching member 11F pinches slidably the sliding member 11E while the sliding member 11E is inserted into the recesses 11$f$ of the pinching member 11F.

The pinching member 11F has a screw hole 41$e$ along the longitudinal direction of the bridge member 40 at a side where the protrusion is positioned nearer the bridge member 40B than the recess portion 11$f$ and a bolt 41$f$ is screwed to the screw hole 41$e$. A shaft 41$g$ passes through the protrusions that are opposite side to those in which the screw hole 41$e$ is positioned. When loosening the bolt 41$f$, the sliding member 11E is allowed to slide to the pinching member 11F and the sliding member 11E and the pinching member 11F are rotatable as a fulcrum of the bolt 41$f$.

When rotating the sliding member 11E, like an arrow D shown in FIG. 10, the sliding member 11E, the pinching member 11F, the pins 12, the pin-retaining member 14B and the holding unit 20 are integrally rotated. The sliding member 11E and the pins 12 rotate while they maintain a condition in which they extend along a direction that is perpendicular to the longitudinal direction of the bridge member 40B. The sliding member 11E is also rotatable to a contrary direction of the arrow D, which is not shown.

When sliding the sliding member 11E in the pinching member 11F, the level confirmation unit 10B slides to a direction that is perpendicular to the longitudinal direction of the bridge member 40B. Namely, when sliding the sliding member 11E in the pinching member 11F, it is possible to slide the level confirmation unit 10B toward a direction where the unit moves toward a liquid level of the molten solder 7 or a direction where the unit moves away from the liquid level of the molten solder 7. When fastening the bolt 41$f$, the sliding member 11E is fixed and its sliding and rotating are restrained.

When the sliding member 11E rotates together with the pinching member 11F, the pins 12 rotate together with this rotation. Therefore, it is possible to make an extending direction of the pins 12 perpendicular to a conveying direction of the printed circuit board 60 as shown in FIG. 10. Accordingly, since the extending direction of the pins 12 may be aligned to a jet direction of the molten solder 7 to the printed circuit board 60, it is possible to confirm the jet level of the molten solder 7 more precisely.

The retaining member 11G is provided for integrally attaching the level confirmation unit 10B, the holding unit 20 and the notifying unit 30B to the bridge member 40B. As shown in FIG. 11, the retaining member 11G has the same width as that of the sliding member 11E and has such a shape that it covers side surfaces of the bridge member 40B and an upper surface thereof. The upper surface of the retaining member 11G has a projection 11$g$ projecting upward. The projection 11$g$ has a hole, not shown, which is communicated to the screw hole 41$e$ of the pinching member 11F and the bolt 41$f$ is inserted into this hole. The retaining member 11G has a screw hole, not shown, on the side surface thereof, into which a male screw 42C is screwed for attaching it to the bridge member 40B.

As the plural pins 12, as shown in FIG. 12, 6 pins 12$a$ through 12$f$, which have been described in the first embodiment, are used. The pins 12$a$ through 12$f$ are stored in a pin-retaining member 14B so as to be aligned and project from a lower part of the pin-retaining member 14B. The pins 12$a$ through 12$f$ have their tips projecting from the pin-retaining member 14B, the tips having lengths which are longer in order of the pins 12$a$ through 12$f$. A difference between the adjacent pins in the lengths of the adjacent pins projecting downward from the pin-retaining member 14B is set to be d1 (0.5 mm). The adjacent pins themselves are positioned at intervals of 2 mm to prevent a bridge by the solder adhered to each pin from occurring.

Conducting wires 13A of the same numbers as the numbers of pins 12 extend along the longitudinal direction of the sliding member 11E and are fixed within the sliding member 11E. The plural conducting wires 13A are configured to have 6 conducting wires 13$a$ through 13$f$.

The pin-retaining member 14B is configured to combine a pair of insulating retaining members 14$g$, 14$h$ up and down. The retaining members 14$g$, 14$h$ are screwed by screws 14$i$, 14$j$. The retaining member 14$h$ retains the pins 12$a$ through 12$f$. Upper ends of the pins 12$a$ through 12$f$ are connected to conductors 15$m$1 through 15$r$1 in the retaining member 14$h$. Since the conductors 15$m$1 through 15$r$1 extend longer in their order, the pins 12$a$ through 12$f$ project downwards from the pin-retaining member 14B in their order.

The retaining member 14$g$ is connected to a lower part of the sliding member 11E. The retaining member 14$g$ retains conductors 15$m$2 through 15$r$2. The conducting wires 13$a$ through 13$f$ are connected to the conductors 15$m$2 through 15$r$2.

In a condition where the retaining members 14$g$, 14$h$ are screwed by the screws 14$i$, 14$j$, the conductors 15$m$1 and 15$m$2 are connected to each other; the conductors 15$n$1 and 15$n$2 are connected to each other; the conductors 15$o$1 and 15$o$2 are connected to each other; the conductors 15$p$1 and 15$p$2 are connected to each other; the conductors 15$q$1 and 15$q$2 are connected to each other; and the conductors 15$r$1 and 15$r$2 are connected to each other. When loosening the screws 14$i$, 14$j$ to release the retaining members 14$g$, 14$h$ from each other, the conductors 15$m$1 through 15$r$1 are released from the conductors 15$m$2 through 15$r$2. Namely, by fastening or loosening the screws 14$i$, 14$j$, it is possible to detachably attach the retaining member 14$h$ to the retaining member 14$g$, so that the pins 12$a$ through 12$f$ are exchangeable together with the retaining member 14$h$.

As shown in FIG. 11, the holding unit 20 includes a housing portion 25A, a rear cover 25B of the housing portion 25A, a transparent plate 25C. As shown in FIG. 12, a slit 25$d$ is provided in a lower surface 25$c$ of the housing portion 25A, an upper end of the sliding member 11E is inserted into the slit 25$d$ and the sliding member 11E is screwed to the housing portion 25A by screws, not shown.

The holding unit 20 is provided with the notifying unit 30B for confirming a contact action, and the notifying unit 30B performs a notifying operation. The notifying unit 30B has plural vibration members 31B through 36B as one example of the notifying member and a storage battery 37.

Figure 13:
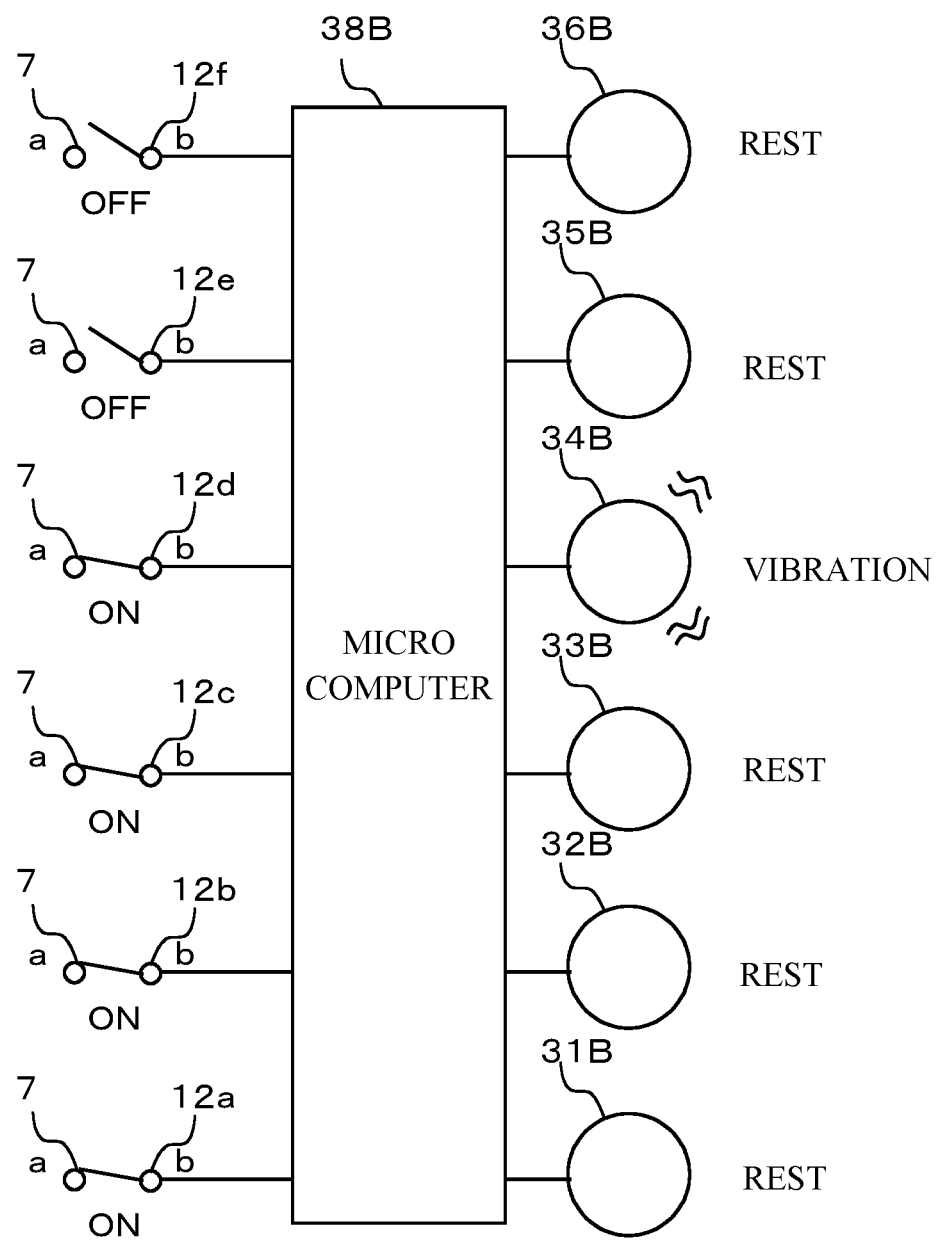
FIG. 13 is a block diagram showing the relationship between pins 12a to 12f and vibrating members 31B to 36B.

FIG. 12 approximately depicts a relationship between the pins 12$a$ through 12$f$ and the vibration members 31B through 36B with a microcomputer 38B shown in FIG. 13 being omitted. The vibration members 31B through 36B make predetermined sounds and are provided in the housing portion 25A. The vibration members 31B through 36B are connected to a negative pole of the storage battery 37 through the microcomputer 38B.

A negative electrode, not shown, which is connected with the negative pole of the storage battery 37, is provided in the housing portion 25A and this negative electrode is connected to the negative pole of the storage battery 37. A positive electrode, not shown, which is connected with the positive pole of the storage battery 37, is provided in the rear cover 25B. Conducting wire extending from the positive electrode, which is provided in the rear cover 25B, is connected to the sliding member 11E.

The jet solder level confirmation jig 300 becomes a closed circuit, when the jet of the molten solder 7 contacts any of the tips of the pins 12, from the pins 12 to the molten solder 7 through the conductors 15m1 through 15r1, the conductors 15m2 through 15r2, the conducting wires 13A, the microcomputer 38B shown in FIG. 13, the vibration members 31B through 36B, the storage battery 37, the bridge member 40B and the metal members 51, 52 of the housing 501 storing the jet solder bath 55 and the vibration members 31B through 36B perform notifying operations.

Namely, in this embodiment, when the molten solder 7 contacts the pin 12a, an electric current flows through the conductors 15m1, 15m2 and the conducting wire 13a to allow the vibration member 31B to vibrate. When the molten solder 7 contacts the pin 12b, an electric current flows through the conductors 15n1, 15n2 and the conducting wire 13b to allow the vibration member 32B to vibrate. When a jet wave of the molten solder 7 contacts the pin 12c, an electric current flows through the conductors 15o1, 15o2 and the conducting wire 13c to allow the vibration member 33B to vibrate. When a jet wave of the molten solder 7 contacts the pin 12d, an electric current flows through the conductors 15p1, 15p2 and the conducting wire 13d to allow the vibration member 34B to vibrate. When a jet wave of the molten solder 7 contacts the pin 12e, an electric current flows through the conductors 15q1, 15q2 and the conducting wire 13e to allow the vibration member 35B to vibrate. When a jet wave of the molten solder 7 contacts the pin 12f, an electric current flows through the conductors 15r1, 15r2 and the conducting wire 13f to allow the vibration member 36B to vibrate. Thus, in this embodiment, based on the difference in the jet level of the molten solder 7, respectively different notifications are performed, thereby enabling 6 levels to be notified.

Since the vibration members 31B through 36B are connected to the microcomputer 38B shown in FIG. 13 and vibrate when receiving any instructions from the microcomputer 38B, it is possible to program various kinds of settings about a vibration pattern of the vibration members 31B through 36B. When the microcomputer 38B is programed to allow only the vibration member corresponding to a pin which contacts the molten solder 7 at the highest position among the pins 12 contacting the molten solder 7 to vibrate, two or more vibration members cannot vibrate at the same time. For example, when the pins 12a through 12d contact the molten solder 7, switches which are connections between the molten solder 7 and each of the pins 12a through 12d turn on but switches which are connections between the molten solder 7 and each of the pins 12e and 12f still turn off. Since the pin which contacts the molten solder 7 at the highest position among the pins 12a through 12d is the pin 12d, only the vibration member 34B corresponding to the pin 12d vibrates but other vibration members do not vibrate.

As shown in FIG. 11, the bridge member 40B is provided with a long slit 41B with a width of about 5 mm which passes through both of the side faces thereof. A position of the slit 41B in the bridge member 40B is different from that of the bridge member 40 described in the first embodiment but the other configurations are identical to those of the bridge member 40.

By pinching the bridge member 40B by means of the retaining member 11G and screwing the male screw 42C to the retaining member 11G and the slit 41B of the bridge member 40B, the jet solder level confirmation jig 300 is fixed to the bridge member 40B. When loosening the male screw 42C, the level confirmation unit 10B and the holding unit 20 are slidable along the slit 41B in the bridge member 40.

[Handling Example of Jet Solder Level Confirmation Jig 300]

The handling example of the jet solder level confirmation jig 100 shown in FIGS. 6 and 7 is applicable to the handling example of the jet solder level confirmation jig 300. Namely, at the step ST1, an operator sets the jet level of the molten solder 7 in the jet soldering device 500 shown in FIG. 10 to be the target level Hx of the jet and jets the molten solder. In this moment, the printed circuit board 60 is removed from a position above the substrate-conveying units 53, 54 and the jet solder bath 55.

At the step ST2, the operator mounts the bridge member 40B on a gap between the metal members 51, 52 of the housing 501 shown in FIG. 1, thereby mounting the jet solder level confirmation jig 300 above the molten solder 7.

At the step ST3, the operator moves the level confirmation unit 10B to a position where the jet level of the molten solder 7 should be confirmed by sliding the level confirmation unit 10B along the slit 41B in the bridge member 40B. More in detail, the male screw 42C shown in FIG. 11 is loosened and the level confirmation unit 10B, the holding unit 20 and the notifying unit 30B slide along the long slit 41B of the bridge member 40B. When completing the positioning thereof, the male screw 42C is fastened with the retaining member 11G pinching the bridge member 40B.

At the step ST4, the operator adjusts a height of the level confirmation unit 10B while he or she confirms the notification of the notifying unit 30B. In this embodiment, it is preferable that an inclination of the pins 12 is also changed corresponding to an inclination of the substrate-conveying units 53, 54. Specifically, the bolt 41f shown in FIG. 11 is unfastened and the sliding member 11E and the pinching member 11F rotate as the fulcrum of the bolt 41f. After they rotate so that a conveying direction of the printed circuit board 60 in the substrate-conveying units 53, 54 and a direction where pins 12 extend are perpendicular to each other, the sliding member 11E slides in the pinching member 11F. In this embodiment, he or she adjusts the height of the pins 12 from the molten solder 7 by sliding the sliding member 11E in the pinching member 11F until a desired notification is given when a condition where any of the vibration members 33B, 34B vibrates is set to be the desired notification. When any of the vibration members 31B, 32B vibrates, he or she slides the sliding member 11E so that it approaches the molten solder 7, thereby lowering the sliding member 11E. When any of the vibration members 35B, 36B vibrates, he or she slides the sliding member 11E so that it moves away from the molten solder 7, thereby lifting up the sliding member 11E.

At the step ST5, the operator fastens the bolt 41f when he or she confirms such a desired notification and the sliding member 11E and the pinching member 11F are fixed to the retaining member 11G.

At the step ST6, the operator removes the jet solder level confirmation jig 300 from the metal members 51, 52 of the housing 501. Accordingly, the level confirmation unit 10B keeps a condition in which the target level Hx of the jet is recorded.

At the step ST7, the operator sets the printed circuit board 60 on the substrate-conveying units 53, 54 to perform the soldering. At the steps ST8, 9, the operator removes the printed circuit board 60 from a position above the substrate-conveying units 53, 54 and the jet solder bath 55 after a predetermined period of time elapses since the jet soldering process starts and again mounts the jet solder level confirmation jig 300 on a gap between the metal members 51, 52 of the housing 501.

At the step ST10, the operator confirms the notification from the notifying unit 30B. When the operator confirms the desired notification such that any of the vibration members 33B, 34B vibrates, the process goes to the step ST13 because the jet level of the molten solder 7 is not changed from the target level Hx of the jet. Incidentally, even when a condition where any of the vibration members 33B, 34B vibrates is set to be a desired notification at the step ST4, it is estimated that a desired notification is given when any of the vibration members 33B, 34B vibrates at the step ST10. When the desired notification may not be confirmed, the process goes to the step ST11 for returning to the target level Hx of the jet because the jet level of the molten solder 7 is changed from the target level Hx of the jet.

At the steps ST11, 12, the operator changes the jet level of the molten solder 7 by regulating the driving voltage of the jet pump or adding the solder until the desired notification is confirmed. When any of the vibration members 31B, 32B vibrates, he or she raises the jet level of the molten solder 7 by increasing the driving voltage of the jet pump or adding the solder because the jet level of the molten solder 7 becomes lower and any solder adhesion failure occurs at the printed circuit board 60 when the jet continues under this condition. When any of the vibration members 35B, 36B vibrates, he or she decreases the jet level of the molten solder 7 by decreasing the driving voltage of the jet pump because the jet level of the molten solder 7 becomes higher and the solder adheres up to an upper surface of the printed circuit board 60 when the jet continues under this condition, thereby causing any failure to occur at the substrate.

At the step ST13, the operator removes the jet solder level confirmation jig 300 when he or she confirms the desired notification. The steps ST8 through ST13 may be repeatedly carried out once every predetermined time, for example, two hours.

Effects

By the jet solder level confirmation jigs 100, 200, 300 according to the embodiments, it is precisely confirm the jet level depending on the situation of contact or non-contact between each of the respective pins and the molten solder, thereby easily enabling precise adjustment of the jet level, because tips of the plural pins 12 respectively have different heights. It is possible to confirm in detail not only whether or not the molten solder 7 has the target level Hx of the jet but also how the level of the molten solder 7 is either higher or lower than the target level Hx of the jet when the molten solder 7 has not the target level Hx of the jet. In addition, according to the jet solder level confirmation jigs 100, 200, 300, it is possible to provide a jet solder level confirmation jig which is handy to carry and has simple and easy structure.

By the methods of handling the jet solder level confirmation jigs 100, 200, 300, it is precisely confirm the situation of contact or non-contact between each of the respective pins 12 and the molten solder 7 depending on the notifying operation by the notifying unit 30B, thereby enabling any precise adjustment to be easily performed. Even when the jet level of the molten solder 7 is changed from the first set target level Hx of the jet every predetermined time of period while the jet soldering device 500 is in operation, it is possible to confirm in detail how the level of the molten solder 7 is either higher or lower than the target level Hx of the jet. Since the level confirmation units 10, 10A, 10B can record the target level Hx of the jet of the molten solder 7, it is possible to make the molten solder 7 the target level Hx of the jet.

Although a case where 2 or 6 pins are used as the plural pins 12 has been described in the above embodiments, the numbers of pins 12 are not limited thereto: When the plural pins 12 are two or more, the effects of this invention may be attained.

Additionally, although the difference d1 between the heights of the respective tips of the plural pins 12 has been set to be 0.5 mm and a distance between the adjacent pins has been set to be 2 mm, the invention is not limited thereto: The difference d1 may be suitably determined depending on the required precision when confirming the level of smooth molten solder jetted from a secondary jet nozzle. Further, the difference d1 and the distance between the adjacent pins may be suitably changed corresponding to various kinds of conditions such as a thickness of the substrate to be conveyed, precision for detecting the jet level, kinds of the solder alloy to be used for soldering, which a primary jet nozzle or a secondary jet nozzle it is used for. Accordingly, it is applicable thereto by preparing retaining members including pins having the different differences d1 between the heights of tips and the different distances between the adjacent pins by unitizing them.

In the first embodiment, since the light-emitting members 31 through 36 are configured to be provided as the notifying member corresponding to the numbers of the plural pins 12 and the light-emitting members 31 through 36 turn on to perform the notification, the operator may confirm the notification even when he or she is at a distance from the jet solder bath 55, and he or she can adjust the jet level of the molten solder 7 while confirming the lighting of the light-emitting members 31 through 36. In addition, as the light-emitting members 31 through 36, an incandescent lightbulb, a light-emitting element utilizing organic EL or the like other than a light-emitting diode can be used. Further, the invention is not limited to that the light-emitting members are provided corresponding to the numbers of the plural pins 12. The number of the light-emitting members is decreased, for example, one light-emitting member which emits light of plural colors is provided and it may perform the notification by different light-emitting patterns with respect to respective plural pins 12. By decreasing number of parts of the notifying member with respect to the plural pins 12, it is possible to realize an easier structure which is handy to carry.

In the second embodiment, since the communication member 39 instructs the notifying operation to the external terminal 39B, the operator may confirm whether or not the jet level of the molten solder 7 has the target level Hx of the jet even when he or she is at a distance from the jet solder level confirmation jig 200, and he or she can adjust the jet level of the molten solder 7 while confirming the notifying operation. Incidentally, although the communication member 39 has been organized by Bluetooth (registered trademark), the invention is not limited thereto: For example, the communication member 39 may be used in Wi-Fi (Wireless Fidelity), ZigBee (registered trademark), wireless LAN (Local Area Network) or the like.

In the third embodiment, since the vibration members 31B through 36B changing the sound pattern when contacting the pins are provided as the notifying member, the operator may aurally confirm whether or not the desired jet level is obtained and how different level the molten solder has from the desired jet level. In addition, since the vibration members 31B through 36B perform any notification with sound, the operator may confirm whether or not the jet level of the molten solder 7 has the target level Hx of the jet even when he or she is at a distance from the jet solder level confirmation jig 300, and he or she can adjust the jet level of the molten solder 7 while confirming the notifying operation.

Although the notifying operations by the light-emitting members 31 through 36, the communication member 39 and the vibration members 31B through 36B have been confirmed in the above-mentioned embodiments, the invention is not limited thereto. Although these notifying members have been operated via the microcomputers 38, 38A and 38B, the invention is limited thereto: The notifying member may be operated without going through the microcomputers 38, 38A and 38B.

Further, as the notifying member, a display member for displaying different contents when contacting the pins may be provided. When the driving voltage of the jet pump is adjusted until the desired contents are displayed and the notifying operation by the desired display is confirmed, the adjustment of the jet of the molten solder 7 is stopped in the jet soldering device 500. Therefore, even when the display member is provided, the operator may confirm whether or not the desired jet level is obtained and how different level the molten solder has from the desired jet level.

The light-emitting member, the display member and the like may be attached to an upper surface or an inclined portion, not shown, of the housing portion 25A corresponding to a visual position of the operator or the operator may more easily recognize the notifying operation by configuring the holding unit 20 to be rotatable about the sliding member 11A to the visual position of the operator.

Thus, the operator may adjust the jet level of the molten solder 7 while confirming the notifying operation by the notifying member such as the light-emitting member, the vibration member, the communication member, the display member or the like even when he or she is at a distance from the jet solder level confirmation jig 100, 200 or 300.

In the first and third embodiments, since the pin-retaining members 14A have been unitized so as to be detachable from the sliding member 11A and the retaining member 14h of the pin-retaining member 14B has been detachable from the sliding member 11E, the pins 12 are exchangeable together with the pin-retaining member 14A, 14B without requiring to exchange the entire jig even if the pins 12 are eaten due to a long time of use. Therefore, it is possible not only to decrease the exchanging costs of the pins 12 and but also to provide the jet solder level confirmation jig 100 or 300 which is available for a long time.

In addition, it is applicable by unitizing and preparing plural retaining members including pins having the various differences d1 between the heights of tips and/or the different distances between the adjacent pins and suitably selecting them according to various kinds of conditions such as a thickness of the substitute to be conveyed, precision for detecting the jet level, a kinds of solder alloy to be used for soldering, which a primary jet nozzle or a secondary jet nozzle it uses for, or the like.

Further, when the sliding member 11A is slidable in the tubular member 11B and the tubular member 11B can hold the sliding member 11A in the jet solder level confirmation jig 100 or 200, the protrusions 11a of the sliding member 11A and the hollows 11b of the tubular member 11B, which are shown in FIG. 2, may be omitted or one or more of the projections 11a or the hollows 11b may be provided.

Although, in the jet solder level confirmation jig 100, 200, the sliding member 11A, the tubular member 11B, the plate member 11C have been preferably made of conductive materials, a circuit may be configured to allow an electric current to flow the bridge member 40 from the storage battery 37. For example, when the sliding member 11A contacts the bridge member 40, the tubular member 11B and the plate member 11C may not be conductive.

In addition, although a case where, in relation to the scale of the jet solder level confirmation jig 100, it is marked on the sliding member 11A has been explained, the invention is not limited thereto. For example, a scale by a predetermined unit may be marked on the bridge member 40 on its longitudinal direction or the scale may be omitted. When the scale is marked on the bridge member 40 on its longitudinal direction, it is easily possible to move an adjustment position of the jet solder level based on the scale to a direction that is almost perpendicular to a conveying direction of the printed circuit board. Further, the scale with a predetermined interval may be provided on the sliding member 11D, 11E of the jet solder level confirmation jig 200, 300.

[Fourth Embodiment]

The following will describe a jet solder level confirmation jig 400 according to the fourth embodiment with respect to respective figures. The jet solder level confirmation jig 400 is a variation of the jet solder level confirmation jig 100 according to the first embodiment and no power supply unit is provided in a holding unit 20, but power is supplied from a power supply unit 510 of a jet soldering device 500. In the jet solder level confirmation jig 400, like sign is applied to like member in the jet solder level confirmation jig 100 according to the first embodiment, thereby omitting the detailed explanation thereof.

The jet solder level confirmation jig 400 has a level confirmation unit 10 which confirms the jet level of the molten solder 7, a holding unit 20 which holds the level confirmation unit 10, a notifying unit 30 for notifying the jet level and a bridge member 40 which is bridged above a housing 501.

The level confirmation unit 10 includes a sliding member 11A that is held below the holding unit 20, a holding member 11K that slidably holds the sliding member 11A with respect to the bridge member 40, plural pins 12 which are provided below the sliding member 11A, and a pin-retaining member 14A which retains the pins 12.

Figure 14:
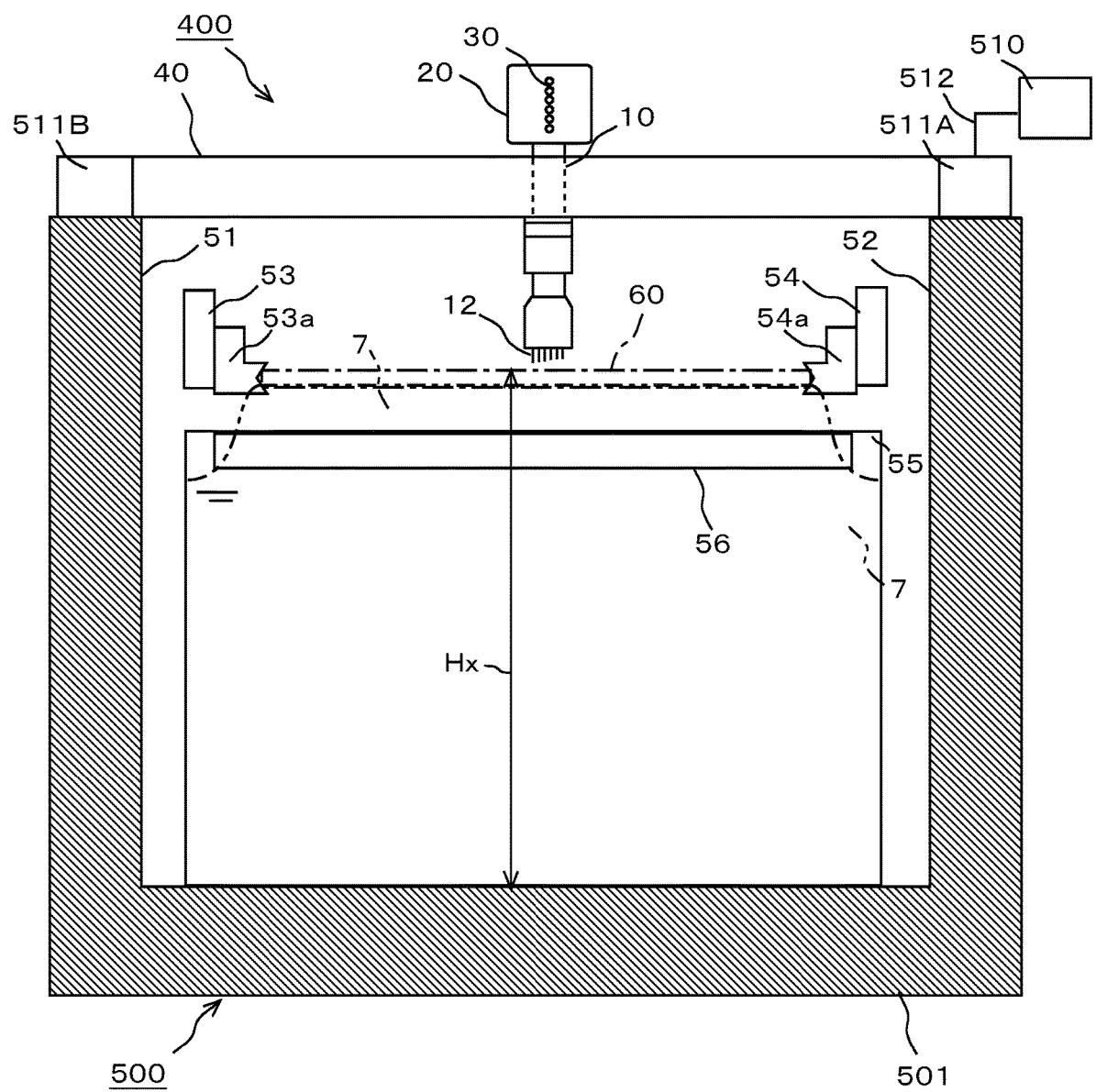
FIG. 14 is a diagram showing a configuration example of a jet solder level confirmation jig 400 as a fourth embodiment.

The sliding member 11A is made of conductive materials and has a long tubular shape. As shown in FIG. 14, a scale may be marked on the sliding member 11A along the longitudinal direction thereof by a predetermined unit. It is preferable that the scale on the sliding member 11A indicates a distance from a tip of a pin which is arranged around the middle of the plural pins 12 because it is used as a mark of a position on which the sliding member 11A is fixed when the jet level of the molten solder 7 becomes a desired level, namely, a target level Hx of the jet.

The holding member 11K is made of a conductive material. The holding member 11K has a groove having approximately the same shape as the outer periphery of the sliding member 11A, and the sliding member 11A is made to enter the groove and is fixed to the bridge member 40 by a screw 11L. The sliding member 11A is slidable in a direction orthogonal to the bridge member 40 by loosening the screw 11L, and the position thereof is fixed on the bridge member 40 by tightening the screw 11L.

When the sliding member 11A slides with respect to the bridge member 40, the level confirmation unit 10 slides toward a direction which is perpendicular to the longitudinal direction of the bridge member 40. In other words, when the sliding member 11A slides with respect to the tubular member 11B, it is possible to slide the level confirmation unit 10 to a direction which approaches a liquid level of the molten solder 7 or moves away therefrom.

Figure 15:
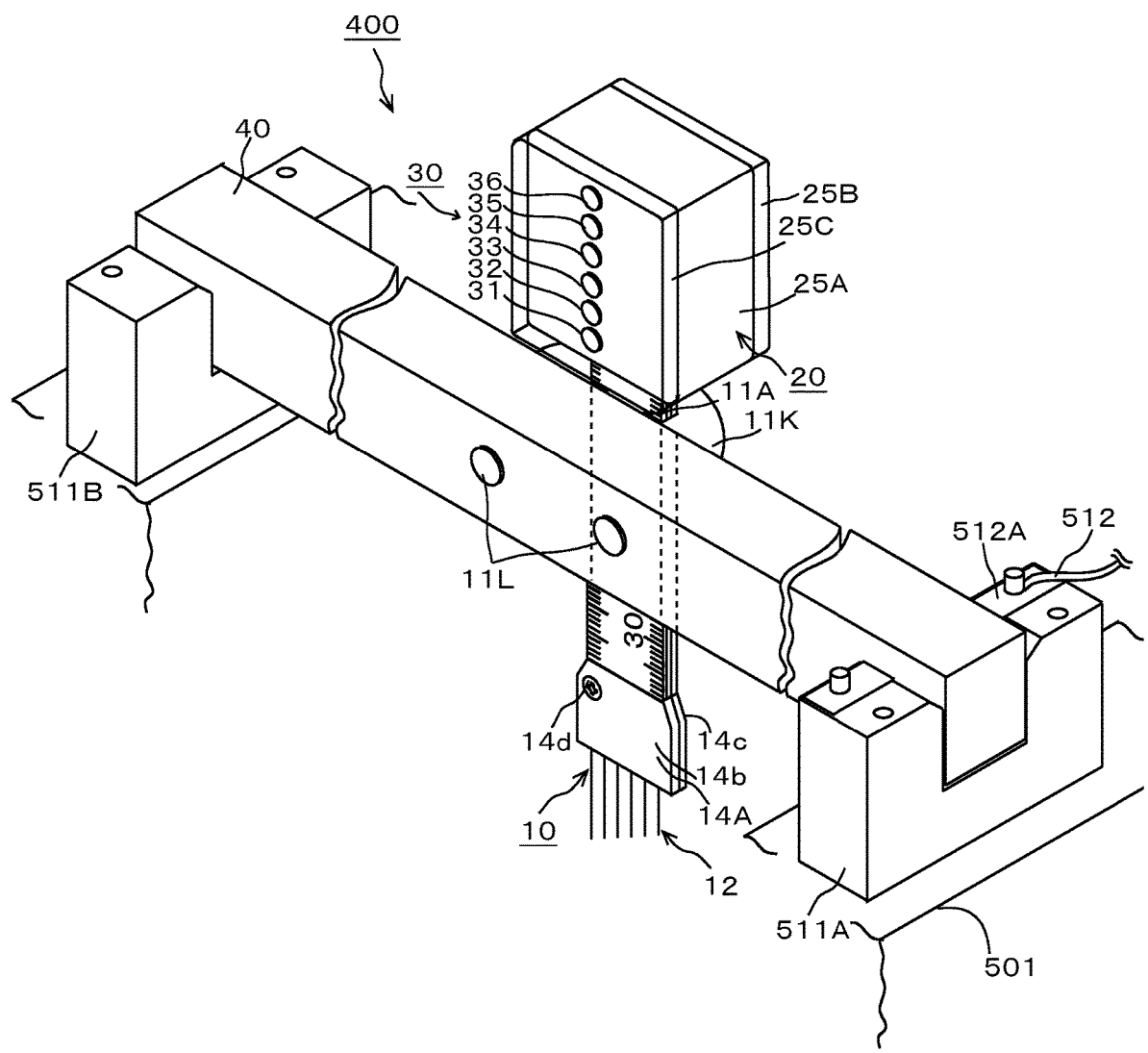
FIG. 15 is a perspective view showing a configuration example of the jet solder level confirmation jig 400.

As shown in FIGS. 14 and 15, the jet soldering device 500 is provided with a pair of supporting units 511A and 511B that support the bridge member 40 on the housing 501, and a conductive member 512A is provided in the one supporting unit 511A. A power supply line 512 is connected to the conductive member 512A.

The pair of supporting units 511A and 511B is attached to the housing 501 of the jet soldering device 500 through an insulating member (not shown), and the supporting units 511A and 511B are electrically insulated from the housing 501.

Figure 16A:
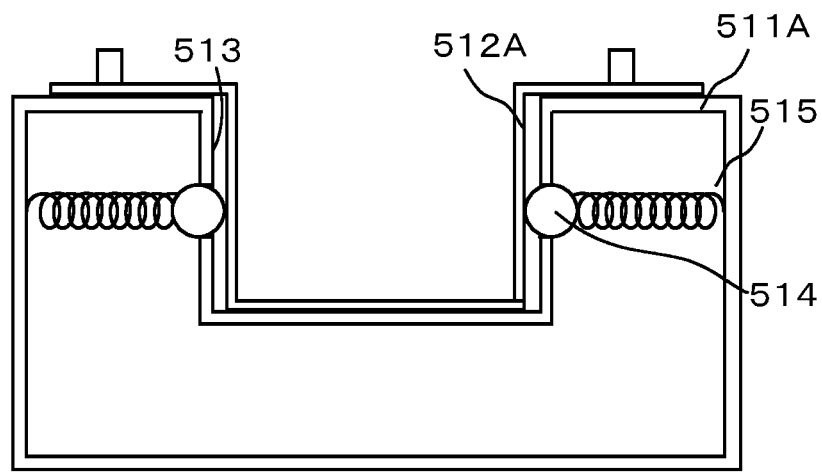
FIG. 16A is a cross-sectional view showing a configuration example of a supporting unit 511A.

As shown in FIG. 16A, in one supporting unit 511A, balls 514 which constitute one pressing member are biased by springs 515 against side wall parts 513 on both sides of the groove part with an open top where the bridge member 40 is to be inserted, and protrude therefrom, so that the conductive member 512A is pressed by the springs 515 via the balls 514.

Figure 16B:
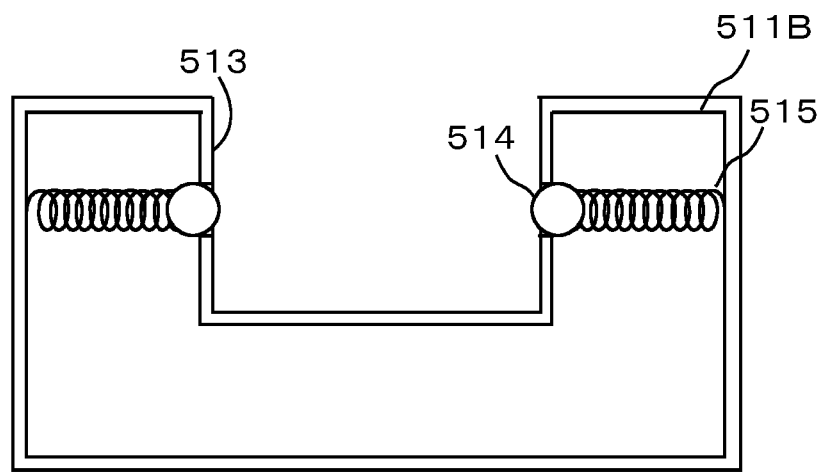
FIG. 16B is a cross-sectional view showing a configuration example of a supporting unit 511B.

As shown in FIG. 16B, in the other supporting unit 511B, balls 514 which constitute the one pressing member are biased by springs 515 against side wall parts 513 on both sides of the groove part with an open top where the bridge member 40 is to be inserted, and protrude therefrom.

Thus, the bridge member 40 is attachable to and detachable from the one supporting unit 511A and the other supporting unit 511B. The conductive member 512A is pressed against the bridge member 40 by the springs 515 via the balls 514, so that the side attached to the one supporting unit 511A of the bridge member 40 is held on the supporting unit 511A. In the supporting unit 511A, the conductive member 512A is pressed against the bridge member 40, so that mechanical fixation of the bridge member 40 in an attachable/detachable state is reliably performed, and electrical conduction is reliably performed.

Further, the side attached to the other supporting unit 511B of the bridge member 40 is pressed by the springs 515 via the balls 514 to be held on the supporting unit 511B. In the supporting unit 511B, the bridge member 40 is pressed by the springs 515 via the balls 514, so that mechanical fixation of the bridge member 40 in an attachable/detachable state is reliably performed.

The power supply line 512 is connected to the power supply unit 510 that supplies electricity to a jet pump (not shown). When the bridge member 40 is attached to the supporting unit 511A and the supporting unit 511B, the conductive member 512A and the bridge member 40 are brought in contact with each other, so that the power supply line 512 and the bridge member 40 are electrically conducted.

In the jet solder level confirmation jig 400, the sliding member 11A is electrically conducted with the bridge member 40, and the microcomputer 38, which is the controlling unit, is electrically conducted with the power supply line 512 via the bridge member 40 and the sliding member 11A.

In the jet solder level confirmation jig 400, when the jet of the molten solder 7 is brought into contact with the tip of any of the pins 12, the power supply unit 510, the power supply line 512, the conductive member 512A, the supporting unit 511A, the bridge member 40, the sliding member 11A, the microcomputer 38, the pins 12, the molten solder 7, and the housing 501 housing the jet solder bath 55 are electrically conducted to form a power supply circuit in which electricity is supplied from the power supply unit 510 to the microcomputer 38.

Figure 17:
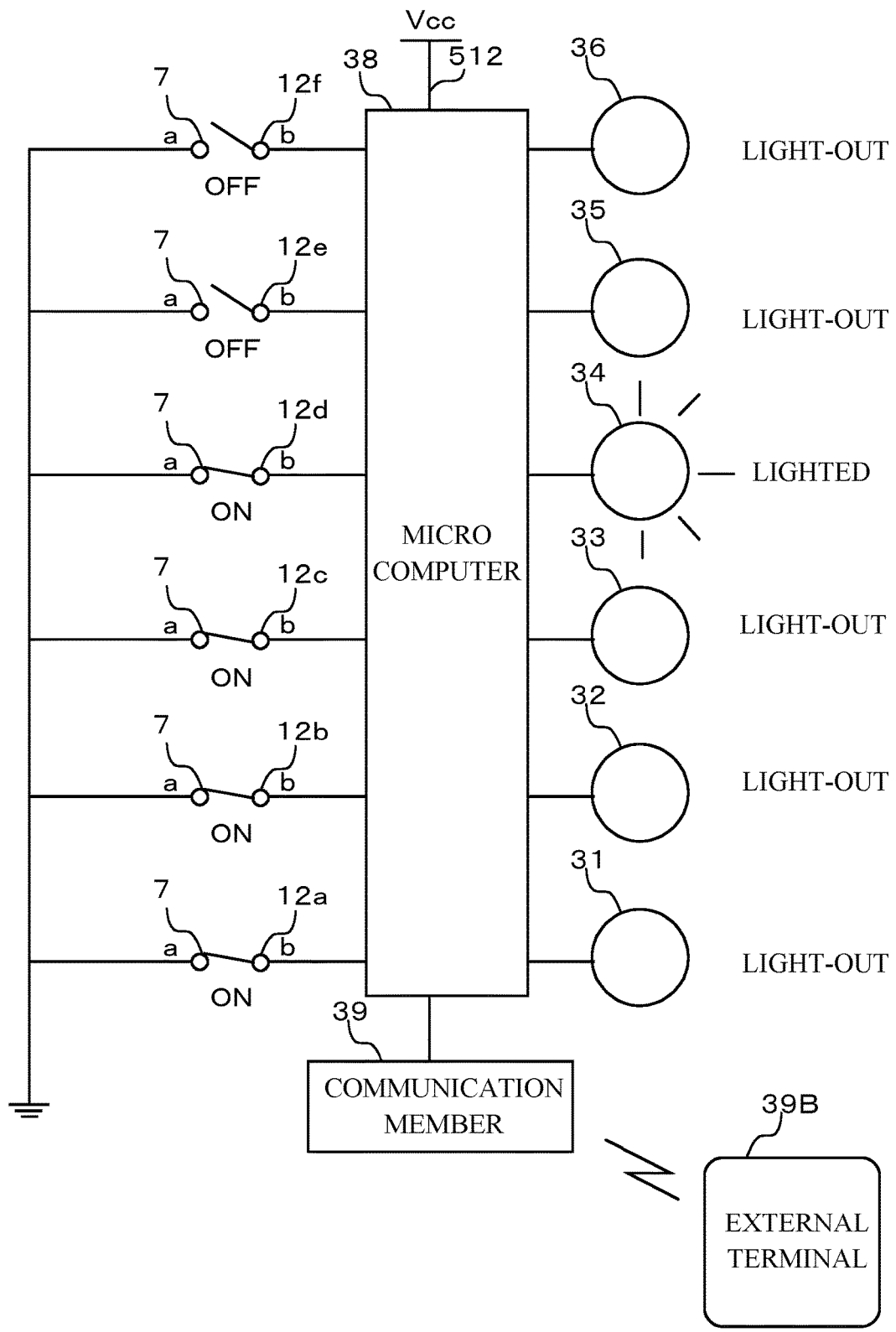
FIG. 17 is a block diagram showing the relationship between pins 12a to 12f and light-emitting members 31 to 36.
Figure 18:
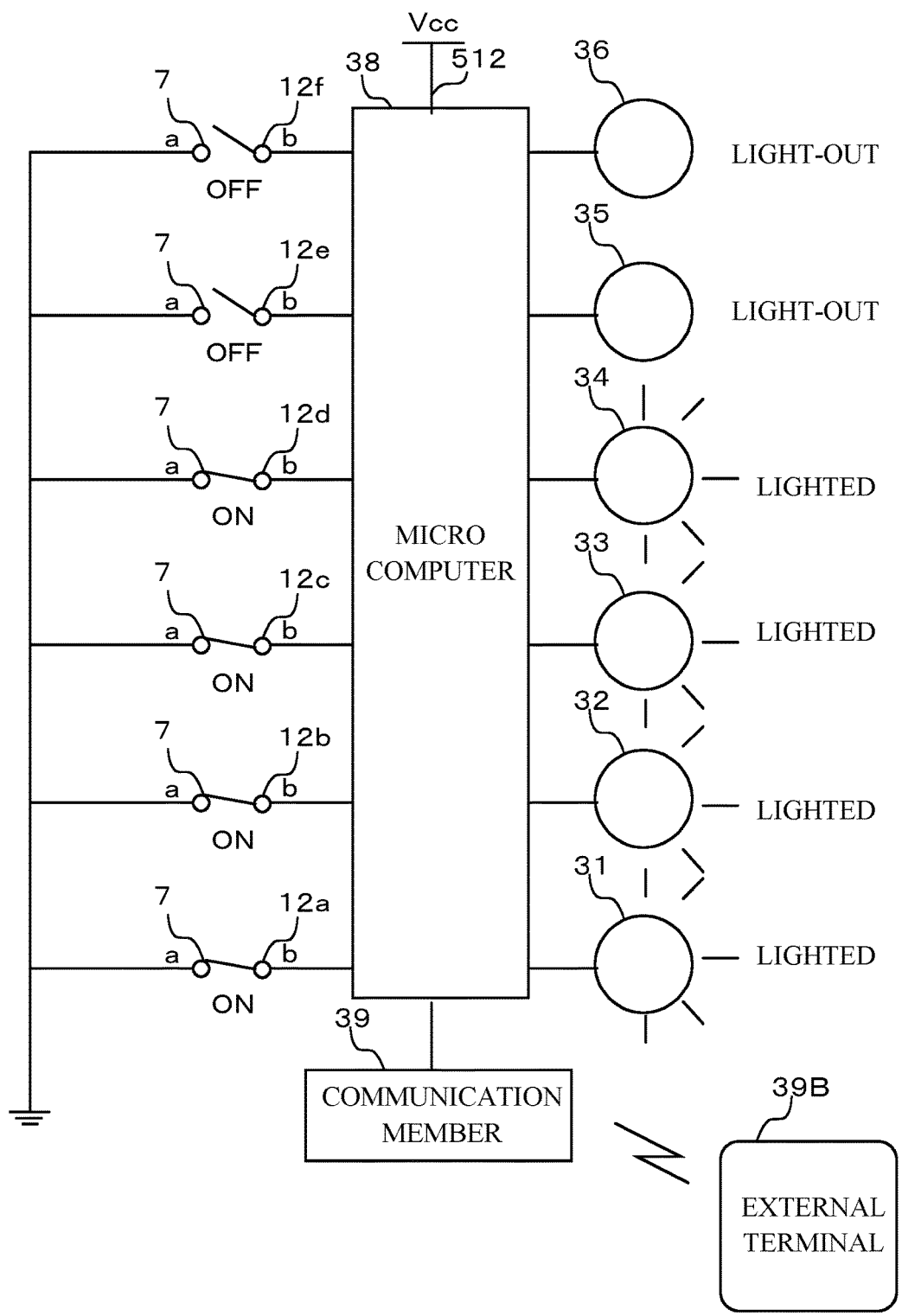
FIG. 18 is a block diagram showing the relationship between the pins 12a to 12f and the light-emitting members 31 to 36.

Since the light-emitting members 31 through 36 are connected to the microcomputer 38 shown in FIG. 17 and are lighted when receiving any instructions from the microcomputer 38, it is possible to program various kinds of settings about a notification pattern on color and lighting of the light-emitting members 31 through 36. When the microcomputer 38 is programed as one example to allow only the light-emitting member corresponding to a pin which contacts the molten solder 7 at the highest position among the pins 12 contacting the molten solder 7 to be lighted, two or more light-emitting members cannot be lighted at the same time. For example, when the pins 12a through 12d contact the molten solder 7, switches which are connections between the molten solder 7 and each of the pins 12a through 12d turn on but switches which are connections between the molten solder 7 and each of the pins 12e and 12f still turn off. Since the pin which contacts the molten solder 7 at the highest position among the pins 12a through 12d is the pin 12d, only the light-emitting member 34 corresponding to the pin 12d is lighted but other light-emitting members are not lighted. In addition, as another example, when the pin which contacts the molten solder 7 at the highest position is the pin 12d as shown in FIG. 18, the microcomputer 38 may make control not only to light the corresponding light-emitting member 34, but also to light the corresponding light-emitting members 31 to 33 based on the fact that the pins 12a to 12c located at positions lower than the pin 12d are also turned on. Thus, the notifying pattern by lighting can be variously changed.

The jet solder level confirmation jig 400 is provided with a communication member 39 for sending notifying instruction to an external terminal 39B. The microcomputer 38 sends the notifying instruction in accordance with the pin 12 contacting the molten solder 7 to the external terminal 39B through the communication member 39 at an arbitrary timing such as an operator's operation. The external terminal 39B is an operation unit (not shown) of a jet soldering device 500 as an example, and the operation unit of the jet soldering device 500 is composed of a display unit such as a display and an input unit such as a touch panel. The external terminal 39B may be an information processing device such as a personal computer connected to the jet soldering device 500, a portable information processing device such as a tablet connected to the jet soldering device 500, or the like.

Figure 19:
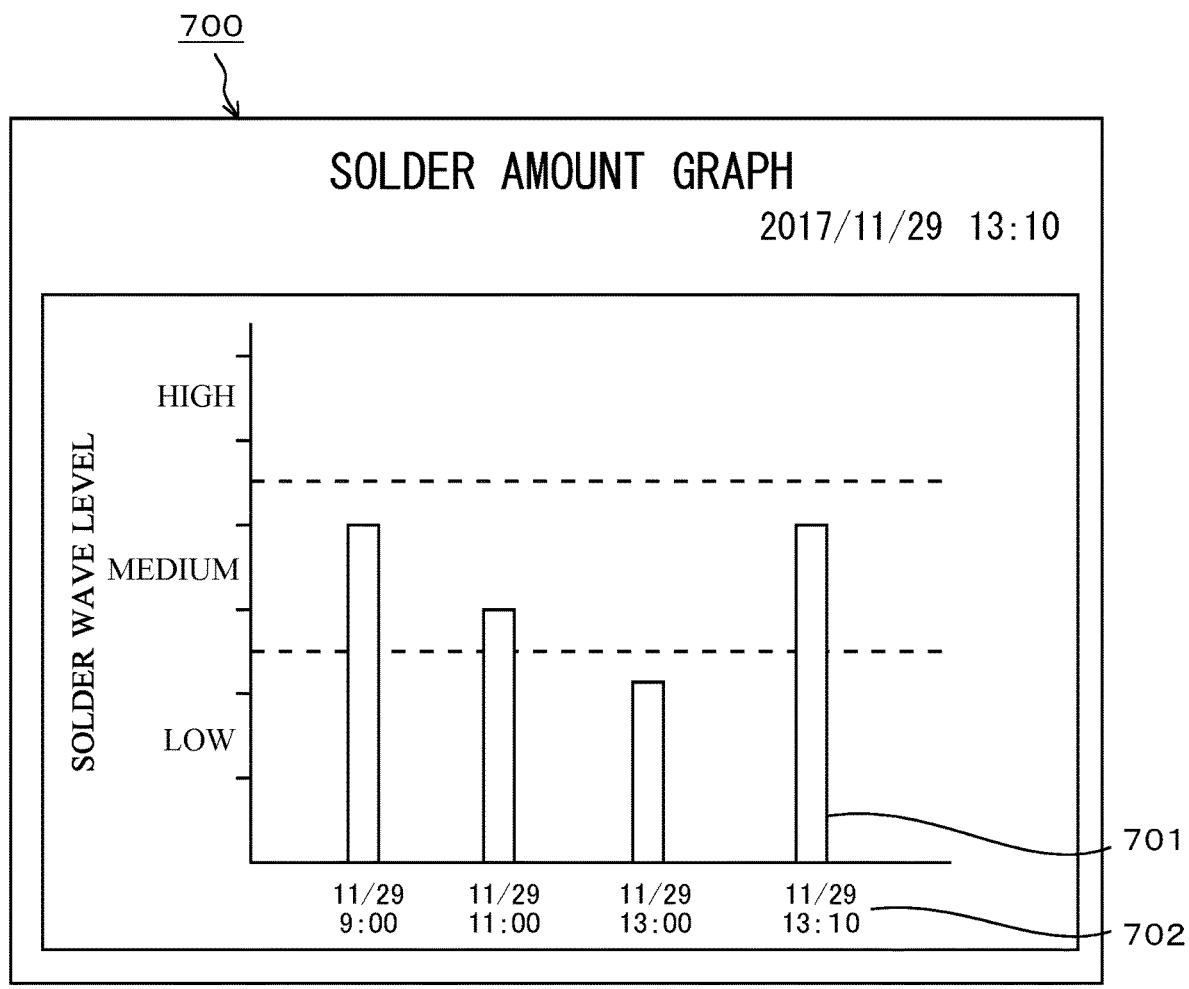
FIG. 19 is a diagram showing a display example of an external terminal 39B.

The external terminal 39B outputs a solder amount graph 700 as shown in FIG. 19, for example by display on a display unit of an operation unit (not shown) of the jet soldering device 500, based on the notifying instruction received from the jet solder level confirmation jig 400. For example, when the pins 12 are composed of six pins 12a to 12f, the height of bar graphs 701 is set to six levels, and the display is performed so that the height of the bar graphs is changed in accordance with the position of the pin 12 contacting the molten solder 7 at the highest position.

When confirmation of the jet solder level is performed and an operation to send a notifying instruction is performed, the external terminal 39B outputs time information 702 that specifies the date and time when the jet solder level was confirmed in correspondence with the bar graph 701, so that a history of the jet level can be output. For example, "11/29 9:00" as the time information 702, as shown in FIG. 19, means 9:00 on November 29, indicating that the jet solder level at the start of the soldering operation of the substrate (in FIG. 19, "Solder Wave Level") falls within the appropriate range defined by broken lines. In this case, the pin contacting the molten solder 7 is the pin 12*d*. In this embodiment, it is determined that the position where the pin 12*c* or 12*d* is brought into contact with the molten solder 7 is within the appropriate range of the jet solder level. The confirmation as to whether the jet solder level falls within the appropriate range is performed, for example, every predetermined time. In this embodiment, the jet solder level is confirmed every two hours. When soldering is applied to the substrate, the solder amount decreases due to dross or the amount required for soldering over time, so that the jet solder level gradually decreases from the initial state. This operation is performed every predetermined time, in order to prevent a solder joint failure to the substrate due to a gradual decrease in molten solder amount. In a case shown in FIG. 19, it is indicated that the jet solder level has fallen within the appropriate range at the time of measurement on "11/29 11:00", but the jet solder level has fallen outside the appropriate range at the time of measurement on "11/29 13:00". Based on the measurement results, an operation is performed so that the jet solder level falls within the appropriate range, such as replenishing the solder or raising the drive voltage of the jet pump to increase the rotation speed of the motor of the pump.

After these operations, it is confirmed (11/29 13:10) using the jet solder level confirmation jig 400 that the jet solder level falls within the appropriate range, and then the soldering operation to the substrate is performed again. Data at the time of these measurements is recorded as a history. This history is sent to the external terminal 39B by the communication member 39 at an arbitrary timing such as the operator's operation, and is displayed as the solder amount graph shown in FIG. 19 as an example. Therefore, the temporal transition of jet solder level can be grasped. If the external terminal 39B is an operation unit (not shown) of the jet soldering device 500, it is possible to easily perform operations such as replenishment of solder to the jet soldering device 500 and control of the output of the jet pump while confirming the history of jet level.

Effect

Since the heights of the tips of the plurality of pins 12 are different in the jet solder level confirmation jig 400 of the fourth embodiment, it is possible to accurately confirm the jet level from the state of contact or non-contact between each of the pins and the molten solder 7 and to easily adjust the jet level precisely. It is possible not only to confirm whether the molten solder 7 has the target level Hx of jet, but also to confirm in detail how higher or lower the molten solder 7 is from the target level Hx of the jet when the molten solder 7 does not have the target level Hx of jet.

Furthermore, since the jet solder level confirmation jig 400 receives power supply from the power supply unit 510 of the jet soldering device 500, it is possible to suppress the operation stoppage due to the consumption of the storage battery. Further, by attaching the bridge member 40 to the supporting units 511A and 511B, mechanical fixing of the bridge member 40 can be reliably performed in an attachable/detachable state, and electrical conduction is reliably performed. The electrical connection between the jet solder level confirmation jig 400 and the jet soldering device 500 can be easily made without inserting or removing a connector or the like.

In addition, the handling examples of the jet solder level confirmation jigs 100, 200, 300, 400 are not limited to the embodiments described above. For example, they may be used when the jet level is set to the target level Hx of jet before the beginning of the operation of the jet soldering device 500. When, for example, using the jet solder level confirmation jig 100, firstly, the operator removes the printed circuit board 60 from the substrate-conveying units 53, 54 and the jet solder bath 55, and places the jet solder level confirmation jig 100 between the metal members 51, 52 in the upper part of a container in which the molten solder is contained. At this time, the level confirmation unit 10 is slid with respect to the bridge member 40 in a direction that is perpendicular to the direction along the long sit 41, so that the tip of any of the plurality of pins 12 has reached the target level Hx of jet. Next, the jet level of the molten solder is adjusted until the notifying member performs a desired notifying operation. At the time point when the desired notifying operation has been confirmed, the operator removes the jet solder level confirmation jig 100 from the metal members 51, 52 of the housing 501. Thus, the jet level of the molten solder 7 can be set to the target level Hx of jet. Also, when the jet solder level confirmation jigs 200, 300, 400 are used, the jet level can be set to the target level Hx of jet through similar procedures.

INDUSTRIAL APPLICABILITY

The present invention is very suitably applied to the setting of the jet level of molten solder in a jet soldering device and the maintenance of the set jet level.

REFERENCE SIGNS LIST

7: Molten solder
10, 10A: Level confirmation unit
14A, 14B: Pin-retaining member
20: Holding unit
30, 30A: Notifying unit
31 to 36: Light-emitting members
31B to 36B: Vibrating members
37: Storage battery
38, 38A, 38B: Microcomputer
39: Communication member
40: Bridge member
51, 52: Metal member
55: Jet solder bath
100, 200, 300, 400: Jet solder level confirmation jig
500: Jet soldering device

The invention claimed is:
1. A jet solder level confirmation jig comprising:
a level confirmation unit for confirming a level of a jet wave of molten solder;
a holding unit that holds the level confirmation unit;
a notifying unit that notifies the level of the jet wave of the molten solder; and
a bridge member having a length so as to be able to form a bridge in an upper part of a jet solder bath housed within a housing, the bridge member supporting the level confirmation unit in the upper part of the jet solder bath, wherein the level confirmation unit includes:

a sliding member that slides along a direction which is orthogonal to a longitudinal direction of the bridge member; and a plurality of conductive pins provided below the sliding member, the plurality of conductive pins being disposed such that tips of the plurality of conductive pins have different heights along a jetting direction of the jet wave of the molten solder, wherein the notifying unit includes:

a notifying member that performs a notifying operation; and a controlling unit connected to a power supply unit of a jet soldering device to drive the notifying member, wherein the bridge member and the sliding member have conductivity and the power supply unit and the controlling unit are connected via the bridge member and the sliding member, wherein the bridge member is detachably attached to supporting units provided on the housing, wherein the bridge member is supported by a pair of the supporting units, and wherein the bridge member is held on one of the supporting units by pressing a conductive member against the bridge member using one pressing member, which is provided in the one of the supporting units, for pressing the conductive member against the bridge member, and is held on the other one of the supporting units by pressing the other pressing member, which is provided in the other one of the supporting units, for pressing the bridge member against the bridge member using the other pressing member.

2. The jet solder level confirmation jig according to claim 1 wherein the notifying member is any one or a combination of a light-emitting members that emits light of a predetermined color, a display member that performs a notification by display, a vibrating member that produces a predetermined sound, and a communication member that sends and notifies a state of contact between the molten solder and the level confirmation unit to an outside.

3. The jet solder level confirmation jig according to claim 1, wherein the level confirmation unit includes a pin-retaining member which holds the plurality of pins, below the sliding member, the pin-retaining member being removably attached to the sliding member.

4. A method for handling the jet solder level confirmation jig according to claim 1, the method comprising the steps of:

adjusting a jet of the molten solder to a target jet level thereof;

placing the jet solder level confirmation jig between the conductive members which are electrically connected to each other through the molten solder;

regulating a holding position of the level confirmation unit with respect to the bridge member so that the jet of the molten solder is brought into contact with a tip of any of the plurality of pins;

confirming a notifying operation of the notifying unit that operates when the jet of the molten solder is brought into contact with the tip of any of the pins; and controlling the jet of the molten solder so that the notifying unit performs the notifying operation after a predetermined period of time elapses since the confirmation of the notifying operation.

* * * * *